United States Patent

Aoki et al.

[11] Patent Number: 6,160,262
[45] Date of Patent: Dec. 12, 2000

[54] METHOD AND APPARATUS FOR DEFLECTING CHARGED PARTICLES

[75] Inventors: Masahiko Aoki; Masayasu Tanjyo, both of Kyoto, Japan

[73] Assignee: Nissin Electric Co., LTD, Kyoto, Japan

[21] Appl. No.: 09/176,110

[22] Filed: Oct. 21, 1998

[30] Foreign Application Priority Data

Oct. 22, 1997 [JP] Japan ................................ 9-309287

[51] Int. Cl.⁷ .............................................. H01J 37/30
[52] U.S. Cl. ................................ 250/492.21; 250/358
[58] Field of Search ........................ 250/492.21, 398, 250/423 R

[56] References Cited

U.S. PATENT DOCUMENTS

| | | | |
|---|---|---|---|
| 5,311,028 | 5/1994 | Glavish | 250/492.21 |
| 5,350,920 | 9/1994 | Fukuyama et al. | 250/492.21 |
| 5,350,926 | 9/1994 | White et al. . | |
| 5,389,793 | 2/1995 | Aitken et al. . | |
| 5,554,853 | 9/1996 | Rose . | |
| 5,554,854 | 9/1996 | Blake | 250/492.21 |
| 5,554,857 | 9/1996 | Benveniste . | |
| 5,760,405 | 6/1998 | King et al. | 250/423 R |
| 5,760,409 | 6/1998 | Chen et al. | 250/492.21 |
| 5,825,038 | 10/1998 | Blake et al. | 250/492.21 |
| 6,016,036 | 1/2000 | Brailove | 250/423 R |

FOREIGN PATENT DOCUMENTS

| | | |
|---|---|---|
| 0 503 787 | 9/1992 | European Pat. Off. . |
| 58-087747 | 5/1983 | Japan . |
| WO 93/17445 | 9/1993 | WIPO . |

Primary Examiner—Bruce C. Anderson
Attorney, Agent, or Firm—Finnegan, Henderson, Farabow, Garrett & Dunner, L.L.P.

[57] ABSTRACT

A large-area ion beam having a one-directionally long section is generated in a magnetically shielded ion source. The ion beam is bent evenly to form a large center angle of about 90 degrees in the direction of the short side by a window/frame type magnet having a large gap and having left and right frames each wound with a plurality of coils. Then, the ion beam is made to pass through a slit plate having a one-directionally long opening so that unnecessary ions are removed. The ion beam is then radiated onto a subject which makes a translational motion in the direction of the short side of the beam.

14 Claims, 22 Drawing Sheets

VIEW OF BEAM SPREAD IN YZ-PLANE ALONG BEAM PATH
$y_0 = 18cm \quad dy_0 = 30mrad$

METHOD AND APPARATUS FOR DEFLECTING CHARGED PARTICLES

BACKGROUND OF THE INVENTION

1. Field of the Invention

The present invention relates to an ion injection method and apparatus for injecting ions into a large-size processed article such as a semiconductor wafer at a large current and with low current density through an ion beam of low energy in a range of from the order of hundreds of eV to the order of tens of keV.

More specifically, the present invention relates to an apparatus in which a belt-like energy ion beam long in one direction is emitted from an ion source, intensively curved in the direction of the short side of means of a window/frame type magnet and subjected to mass spectrometric analysis so that only a desired kind of ions are injected into a wafer. Because the sectional area of the beam is large, there is characteristic that the current density is small while the current value is large.

2. Description of the Related Art

The ion injection apparatus is an apparatus in which an ion beam emitted from an ion source and having a predetermined amount of energy is injected into a subject through mass spectrometric analysis of the beam. Because the density n of ions to be injected and the area Q of a subject (such as an Si wafer, or the like) are fixed in advance, the total quantity nQ of required ions is determined. Because this is substantially equal to a value obtained by dividing the product of the current value I and the injection time T by the charge q (nQ=IT/q), the current I and the required injection time T are inversely proportional to each other. To enhance throughput, it is better to make the current value I large. Accordingly, the ion injection apparatus has a tendency that the current value is made larger and larger. Mass spectrometric analysis is used so that only a predetermined kind of ions are injected.

A conventional large-current ion injection apparatus is designed so that a narrow ion beam is subjected to mass spectrometric analysis by means of a magnet and then the ion beam is radiated onto a plurality of wafers put on a rotation target.

FIG. 18 is a schematic view of a conventional ion injection apparatus. The apparatus is designed so that an ion beam having a circular section or a square section is emitted from an ion source. The orbit of the beam is bent by means of a mass spectrometric analysis magnet. Then, the beam passes through a slit and strikes against wafers. The diameter of the ion beam is small so as to be in a range of from about 1 cm to about 5 cm. The reason why the beam is narrow is not in that a problem arises in the ion source but in that mass spectrometric analysis cannot be performed if the beam is wide. Although uniform magnetic field is generated by means of a magnet to thereby bend the beam, it is difficult to form uniform magnetic field in a wide range. Accordingly, a narrow beam is generated because of mass spectrometric analysis.

The Si wafer, which is a subject of ion injection, is however a large disk having a diameter of from 20 cm to 30 cm. Because the whole area of the wafer cannot be covered with the narrow ion beam, the beam is relatively displaced horizontally and vertically so that the ion beam is effectively radiated onto the whole area of the wafer. That is, the ion beam must be scanned on the subject. Although the ion beam may be moved left and right, the subject (wafer) is, in most cases, moved. The wafer is attached to a device called "target". A mechanism for moving the target while supporting the target is called "end station". Not only the beam density on the wafer must be uniform but also the beam must be incident onto a surface of the wafer at right angles. Therefor, a rotation target may be provided in the end station so that the wafer is attached to the rotation target. The target is displaced (Sy) to the direction (y-direction) of the surface, while it is rotated (Rz) at a high speed.

Assuming that the direction of the movement of the beam is the z-direction, then, for example, the rotation target is rotated around the z-axis and slowly moved translationally in the y-direction. Assuming that the subject is shaped like a circle with radius R, then the beam is injected into the whole surface of the subject when the rotation target is moved in the y-direction in a range of from −R to +R. The velocity v of the translational motion in the y-direction is not constant.

FIG. 19 shows a view of the relation between rotation (Rz) and translation motion (Sy) of the wafer in the prior art. In the conventional method, ions are injected evenly into the whole surface of the wafer by rotation and translational motion, but the beam moves at a linear speed of 2 nyω on the circumference 2 ny of a circle if the beam strikes on the circumference at a distance v from the center of the wafer.

As v increases, the linear speed caused by rotation at a constant rotation angular speed increases. To compensate this, the velocity v of translational motion in the y-direction must be selected to be low. That is, the velocity v must become high in a neighbor of y=0 and must become low is a neighbor of y=±R. The velocity v of translational motion in the y-direction must be controlled so that the relation v=c/|y| is satisfied. With respect to a range of y>0, the motion is expressed by dy/dt=c/y and this is integrated to obtain a motion of $y=(2ct)^{1/2}$ and $v=(c/2t)^{1/2}$.

1. In a mechanism using a rotational target, a beam optical system is relatively simple. A narrow beam is drawn out of an ion source and subjected to mass spectrometric analysis by means of a magnet so that the beam can be applied onto the target as it is. The end station for supporting the rotation target is, however, complex.

2. For example, the disk on which the wafer is put must make a high-speed rotating motion and a translational motion simultaneously. The translational motion is not simple. The disk must move translationally at such a velocity (v=c/|y|) as inversely proportional to the position of the beam. For example, this has been proposed in θ D. Aitken, F. J. L. Robinson, M. T. Wauk, "Apparatus and Methods for Ion Implantation", U.S. Pat. No. 5,389,793.

3. θ V. M. Benveniste, "METHOD AND APPARATUS FOR ION FORMATION IN AN ION IMPLANTER", U.S. Pat. No. 5,554,857 has proposed an ion injection apparatus in which coils for controlling a quadrupole are added to a mass spectrometric analysis magnet so that convergence of a beam is controlled dynamically. In the proposed apparatus, however, the configuration of the magnet is very complex. Further, also the structure and motion of the end station are complex because a wafer is mounted on the target.

4. Further, in the conventional ion injection apparatus using a mass spectrometric analysis magnet and a rotation target, the beam current must be increased in order to enhance the ability of processing the wafer. If the current in a narrow local beam is increased, however, the current density becomes very high. The beam current density in the wafer is so high that a phenomenon of charging-up becomes remarkable. Accordingly, the beam current cannot be increased so sufficiently. That is, in order to avoid charging-up, the current cannot be increased sufficiently, so that the processing ability is limited.

5. To prevent charging-up, there has been proposed a further method in which low speed electrons are applied to an ion beam so that the electrons are trapped in the ion beam by electrostatic power thus to achieve space charge neutralization to thereby suppress the phenomenon of charging-up.

6. The proposed method can be achieved by attachment of a device called "plasma flood gun" to a neighbor of the wafer.

7. θ N. R. White, M. Sieradzki, A. Renau, "COMPACT HIGH CURRENT BROAD BEAM ION IMPLANTER", U.S. Pat. No. 5,350,926 has proposed an ion injection apparatus in which, after a laterally long divergent beam is converged laterally by means of a first magnet for generating magnetic field longitudinally, made to pass through a long hole so as to be subjected to mass spectrometric separation and diverged laterally, the laterally diverged beam is collimated by means of a second magnet for generating magnetic field longitudinally so that the laterally long collimated beam can be injected into the wafer. Because the vertically thin and laterally wide beam is made to pass through the gap, the gap of the magnet can be selected to be narrow. Because the beam is made to pass through the long hole after the beam is bent at 90 degrees by means of the first magnet, mass spectrometric separation is complete. The apparatus in which mass spectrometric separation is performed after the laterally long beam is ben laterally, however, requires two magnet combinations. Accordingly, the configuration of the apparatus is complex, so that the adjustment of the beam distribution based on the adjustment of pole pieces of the first magnet is difficult.

8. There has been proposed a further method using a large-aperture ion source in which a large-area ion beam taken out from an ion source is moved straight directly so as to be injected into the wafer. Electrodes each having a large area and having a large number of holes are used as a lead-out electrode system such as acceleration electrodes, deceleration electrodes, etc. Mass spectrometric analysis, however, cannot be performed because the large-area ion beam cannot be bent by means of a magnet. Because mass spectrometric separation cannot be performed, there is a possibility that impurities may be injected into the wafer.

9. In short, any simple optical system has been never provided for providing mass spectrometric analysis of a large-current ion beam and transporting the beam.

10. It is an old practice to carry out deflection of ions on the basis of the magnetic field in the field of accelerator. Particularly in the field of high-energy physics, a magnet having a large gap has been produced to enhance the acceptance of a spectrometer used in reaction experiments for elementary particles.

θ J. Allinger, G. Danby, J. Jackson, A. Prodell, "High Precision Superconducting Magnets", IEEE Transactions on Nuclear Science, vol. NS-24, No. 3, June (1977)p 1299

θ T. Inagaki, Y. Doi, H. Hirabayashi, Y. Kato, K. Kawano, H. Sato, S. Sugimoto, K Takamatsu, E. Takasaki, T. Tsuru, H. Yoshimura, O. Asai, T, Satow, "Large Aperture Superconducting Magnet (BENKEI)", Cryogenics February (1984) p83

These show ideas for improving apparatuses attached to a huge accelerator. These are large-scale apparatuses for emitting and deflecting high-energy protons, electrons, positive electrons, etc. These are not small-scale industrial apparatuses. These cannot be applied to an ion injection apparatus, etc.

SUMMARY OF THE INVENTION

It is an object of the present invention to provide a method and apparatus for deflecting charged particles, in which a large-area ion beam is subjected to mass spectrometric analysis to remove unnecessary ions, and then the ion beam is radiated onto a subject so that the ion beam can be injected evenly into the whole surface of the subject by making the subject perform only translational motion.

An apparatus for deflecting charged particles according to the present invention comprises: an ion source having an ion drawing outlet long in a certain direction for generating a belt-like ion beam; a magnet comprising a yoke of a ferromagnetic material having a rectangular section and being curved in its longitudinal direction, a plurality of coils wound on a curved inner frame of the yoke so as to be parallel with a direction of movement of the beam, and a plurality of coils would on a curved outer frame of the yoke so as to be parallel with the direction of movement of the beam; a slit plate having a long hole long in the same direction as the longitudinal direction of the ion source and provided on a beam locus of the beam and in posterior to the magnet; and a mechanism for holding a subject so that the subject makes a translational motion in a direction of a short side of a section of the beam. In this apparatus for deflecting charged particles, magnetic field $B_y$ substantially uniform in the same direction as the longitudinal direction of the ion source is generated in the inside of the yoke by adjustment of currents in the plurality of coils, so that a belt-like ion beam having a section long in a certain direction is emitted from the ion source, made to pass through the yoke so as to be curved in the direction of the short side of the section of the beam by the longitudinal magnetic field, made to pass through the long hole of the slit plate to remove unnecessary ions and radiated onto the subject.

DETAILED DESCRIPTION OF THE INVENTION

Figure 1:
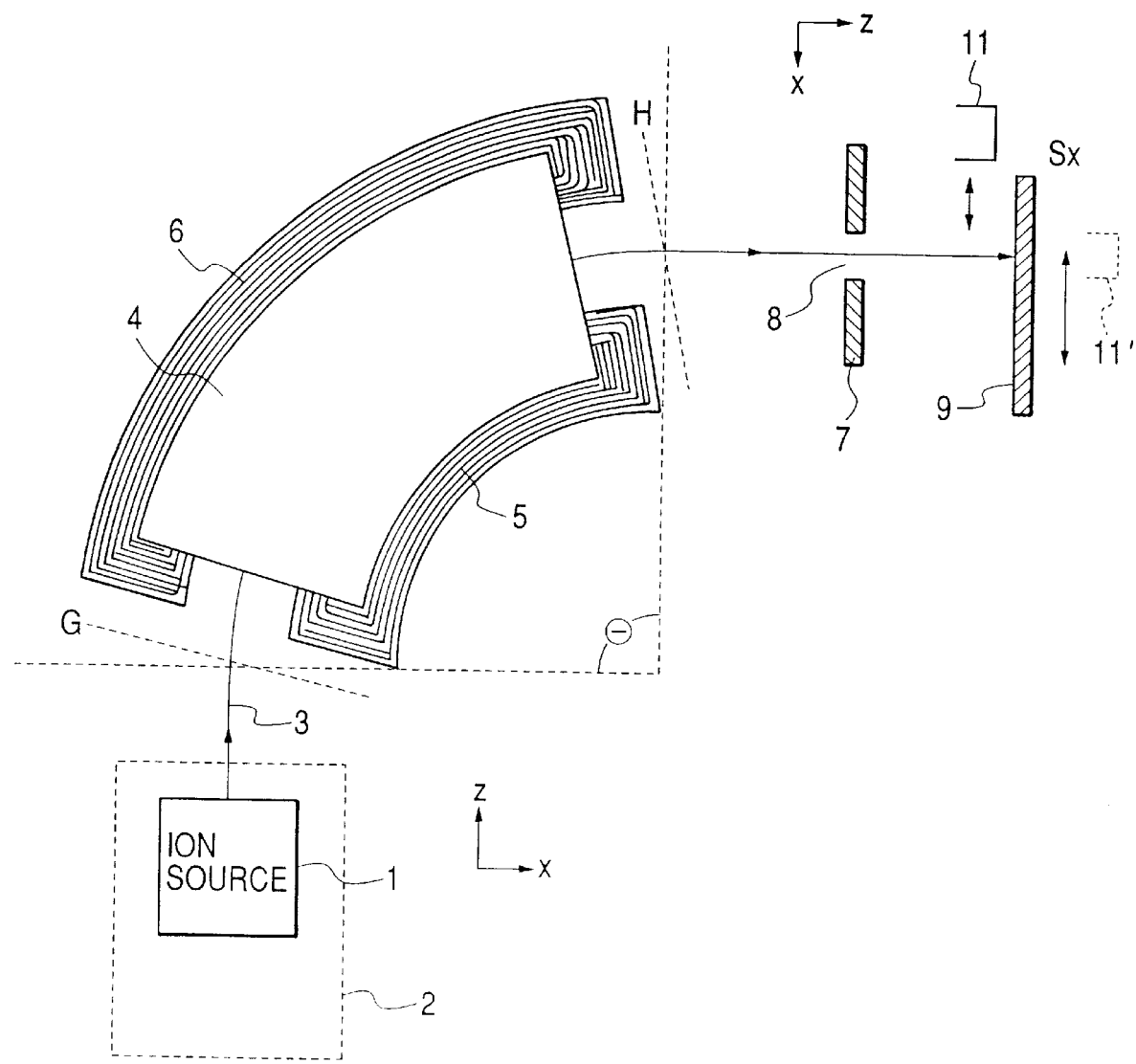
FIG. 1 is a plan view showing the schematic configuration of an ion injection apparatus according to the present invention.

Detailed description of the present invention will be described as follows referring to the accompanying drawings.

In the ion injection apparatus according to the present invention, an ion beam drawn out from an ion source having a large-area drawing outlet long in a certain direction is made to pass through a window/frame type magnet composed of a rectangular yoke curved in the longitudinal direction of the yoke, and a plurality of coils wound in the yoke so as to be parallel with the direction of movement of the beam for generating magnetic field in the lengthwise direction in the opening of the yoke. Accordingly, the beam is deflected, for example, in the direction of the short side of the beam (laterally), and then made to pass through a long hole to thereby remove unnecessary ions. Only ions having a predetermined mass number are selected so as to be injected into a subject which makes a translational motion in the direction of the short side of the beam.

The window/frame type yoke curved in the longitudinal direction thereof and having a rectangular section is designed so that, for example, a main coil M2 is wound on the center portion of an inner frame of the yoke, sub-coils Sa and Sb are wound on opposite sides, respectively, of the main coil M2 so as to be parallel with the direction of movement of the beam, a main coil M1 is wound on the center portion of an outer frame of the yoke, and sub-coils Sd and Sc are wound on opposite sides, respectively, of the main coil M1 so as to be parallel with the direction of movement of the beam.

In the ion beam in the present invention, the ion beam has a section long in a certain direction. For example, the sectional shape of the beam emitted from the ion source is designed so that the size in the longer side is not smaller than 20 cm and the size in the shorter side is in a range of from 2 cm to 10 cm.

Further, the ion source is preferably surrounded by a magnetic shield formed of a material of high magnetic permeability so that the influence of the magnetic field leaking from the magnet on the ion source is suppressed.

To generate the beam long in a certain direction, for example, the ion source may have a plurality of electron emitting sources in one direction so that the quantity of electrons can be adjusted to change the distribution of ion source plasma to thereby change the distribution of beam intensity in the wafer.

Further, a movable Faraday cup or a fixed multi-Faraday cup for measuring the distribution of the ion beam reaching the subject may be provided just in front of the subject, just in rear of the subject or on one and the same plane so that the shape of the ion beam, the size of the ion beam and the quantity of the current in the ion beam can be detected to thereby control the coil current in the magnet and the running state of the ion source.

A parallelism monitor for measuring the parallelism of the incident angle of the ion beam reaching the wafer may be provided so that the parallelism of the ion beam can be adjusted by control of the coil current in the magnet.

The wafer is preferably scanned in the direction of the short side of the one-directionally long belt-like ion beam reaching the wafer so that the ion beam is injected into the wafer evenly.

The lengthwise distribution of the ion beam quantity integrated in the direction of the short side of the one-directionally long belt-like ion beam may be measured by means of a movable or fixed Faraday cup so that the lengthwise distribution of the ion beam quantity is adjusted by changing the magnet coil current and the running state of the ion source to thereby make it possible to perform feedback control to obtain a desired and generally uniform quantity of injection.

The terminology "one-directionally long beam" used herein means a large-area beam having a length of not smaller than 20 cm and a width of from about 2 cm to about 10 cm. For example, the beam is a large-area beam having a length of 40 cm and a width of 5 cm. Because it is difficult to generate uniform magnetic field in the wide gap, it is difficult to bend the one-directionally long ion beam evenly on the basis of the magnetic field parallel with the ion beam. In the present invention, a plurality of independent coils are wound on left and right frames of the curved window/frame type yoke and coil currents are adjusted to thereby generate substantially uniform longitudinal magnetic field in the wide gap between magnetic poles. If uniform longitudinal magnetic field can be generated, unnecessary ions can be removed by the long hole because the one-directionally long belt-like beam can be bent evenly. Further, when a slight gradient is given to the magnetic field instead of the uniform magnetic field, the beam can be converged or diverged freely. By using slight convergence and divergence, the beam may be once converged to the subject and then diverged.

A beam detector (for example, a Faraday cup) capable of moving translationally may be provided just in front of the subject, just in rear of the subject or on one and the same plane as the subject so that the beam current density, the beam spread and the shape of the beam are examined in advance. If the beam does not have a desired shape and density, the coil currents in the magnet and parameters for the ion source are adjusted to obtain a desired ion beam sectional shape.

Further, a slit plate capable of moving translationally may be provided in front of the Faraday cup so that the beam passing through the opening of the slit plate is detected by means of the Faraday cup to thereby examine the parallelism of the beam on the basis of the position of the long hole and the position of the Faraday cup. In the case where the parallelism of the beam is insufficient, currents in coils are adjusted to make the beam parallel. Because also the incident angle to the subject can be examined, the coil currents are adjusted in the case where the angle is not 90°.

The ion source has an outlet long in one direction for generating a one-directionally long belt-like ion beam. Because the motion of plasma is disturbed by the influence of the magnetic field in the mass spectrometric analysis magnet, the ion source is covered with a magnetic shield formed of a material of high magnetic permeability except the outlet. Further, in the case where it is difficult to generate a one-directionally long uniform ion beam, a plurality of ion sources may be arranged in one direction. Further, electron emitting mechanisms in the ion source are filament, microwave, etc. and the plasma density in the lengthwise direction can be adjusted freely when a plurality of such electron emitting mechanisms are arranged in one direction in the inside of the ion source.

The angle θ of deflection of the one-directionally long ion beam is selected to be considerably large, for example, in a range of from about 60° to about 150°, preferably substantially 90°. The longitudinally long beam is bent at about 90 degree in the direction of the short side of the bean by means of the mass spectrometric analysis magnet composed of a curved yoke and plurality of coils so that more complete mass spectrometric analysis can be performed. Because uniform magnetic field could not be generated in a wide range even though there was thought that a one-directionally long beam was bent on the basis of the magnetic field to thereby perform mass spectrometric analysis, the aforementioned thing could not be achieved.

Preferred embodiments according to the present invention will be described as follows.

1. FIG. 1 shows a conceptual view of an apparatus according to the present invention. An ion source 1 has an outlet which is long in one direction so that a one-directionally long ion beam can be generated. This ion source 1 is surrounded by a magnetic shield 2 formed of a magnetic material of high permeability. In the case where a one-directionally long ion beam is difficult to be generated by means of a single electron generating mechanism (filament, microwave source), a plurality of electron generating mechanisms are provided in one direction in the inside of the ion source. The one-directionally long belt-like ion beam 3 enters a one-directionally long opening of a curved yoke 4. Frames in opposite sides of the yoke 4 are wound with coils 5 and 6 respectively. A magnetic field parallel with the longitudinal direction of the beam is generated in the center of the yoke by means of the coils 5 and 6 so as to be upward (or downward). Force in a direction perpendicular to the longitudinal direction of the beam is given to the ion beam by this magnetic field, so that the ion beam is bent at about 90 degrees. The sectional shape of the beam at this point of time is long in one direction so as to be substantially equal to the initial shape.

Then, the beam passes through a long hole 8 of a slit plate 7 and strikes against a subject 9 (wafer). The bending angle θ is substantially 90°, but the yoke 4 is not always present on the whole of the bending angle θ. The magnetic field is present also in the front and rear of the yoke 4 because of leakage of the magnetic field from the yoke, so that an effective magnetic field is spread between G and H. The effective magnetic circuit length $L_{eff}$ is given by $\int B y\ (z)dz = B_0 L_{eff}$ in which z is a coordinate defined so as to be along the center of the path. The x-axis is taken inward in a direction perpendicular to the longitudinal direction of the beam. The longitudinal direction of the beam is the y-axis. Accordingly, the y-direction means a predetermined direction, but the z-direction and the x-direction vary in accordance with the position on the path. The slit plate 7 is a plate parallel with the xy plane. Also the long hole 8 formed in the slit plate 7 is parallel with the xy plane. The long hole 8 is short in the x-direction and long in the y-direction. Also the beam is long in one direction so as to pass through the hole long in the same direction as the longitudinal direction of the hole. A part of the beam having predetermined mass passes through the hole 8, but the residual part of the beam not having predetermined mass cannot pass through the hole 8. Accordingly, only an ion beam having desired mass collides with the wafer 9. The wafer 9 makes a translational motion Sx in the x-direction. Only by the translation movement, the ion beam can be radiated onto the whole surface of the wafer 9. Because it is not necessary to rotate the wafer, the wafer 9 is not required to be attached to a rotation target. Because no rotation target is required, the structure of an end station is simplified. Furthermore, not only rotating motion becomes unnecessary but also the translational motion per e is simplified. If the beam current is constant, the translation motion may be made at a constant velocity (v=const).

Further, a Faraday cup 11 is provided in front of the wafer. The Faraday cup 11 is moved onto the beam so that the beam distribution can be examined. Before the beam is radiated onto the wafer 9, the location and distribution of the beam are examined so that the velocity and range of the translational motion of the wafer can be determined suitably. Alternatively, the Faraday cup may be provided in rear of the wafer as represented by the reference character 11'. In the case where the Faraday cup is provided in rear of the wafer, a plurality of Faraday cups may be arranged as a multi-Faraday cup in the longitudinal direction of the beams so that the lengthwise-direction distribution of the beam current is measured. Further, the Faraday cup may be provided so as to be movable in the same plane as the wafer. Although this is the outline of the apparatus according to the present invention, parts will be described below more specifically.

2. An ion beam, for example, shaped like a ribbon having a size of 40 cm (long side)×5 cm (short side) is drawn out with energy equivalent to the lead-out voltage from the ion source having a one-directionally long outlet. In this example, the sectional area of the beam is very wide so a to be about 200 cm². The sectional area of the beam having a circular section with a diameter of 5 cm as described preliminarily in the prior art is 20 cm² whereas the beam in this example has a sectional area 10 times as large as that in the conventional beam. Because the sectional area is wide, the current density can be reduced. Because the current density is low, there is little possibility that charging-up occurs. Although charging-up occurs easily so that precautions must be taken on charging-up when the subject is an electrical insulator, the present invention is effective also for the electrical insulator. Further, because the sectional area of the beam is wide, the current quantity can be increased to enhance throughput on the assumption that the current density of the beam is constant.

3. The ion beam thus drawn out is deflected in accordance with the mass number by means of a magnet. Although it is difficult to bent such a large-area ion beam at a large center angle θ, a substantially uniform magnetic field perpendicular to the plane of deflection is generated to thereby bend the ion beam at a large curve angle of about 90°. The yoke 4 and the coils 5 and 6 form a magnet for mass spectrometric analysis. It will be relatively easy to generate a uniform magnetic field in a narrow range. In the present invention, however, it is necessary that the yoke is arranged along the curve angle of about 90° to generate a uniform magnetic field along the curve. Furthermore, the gap between magnetic poles is wide. Because the aforementioned beam has a height of 40 cm, the gap between magnetic poles must be not smaller than 40 cm. There are three difficulties as follows; the gap g is large; the path $L_{eff}$ is long; and the path is curved. In order to generate a uniform magnetic field $B_y$ to thereby overcome the difficulties, the magnet is devised specially in the present invention.

Figure 2:
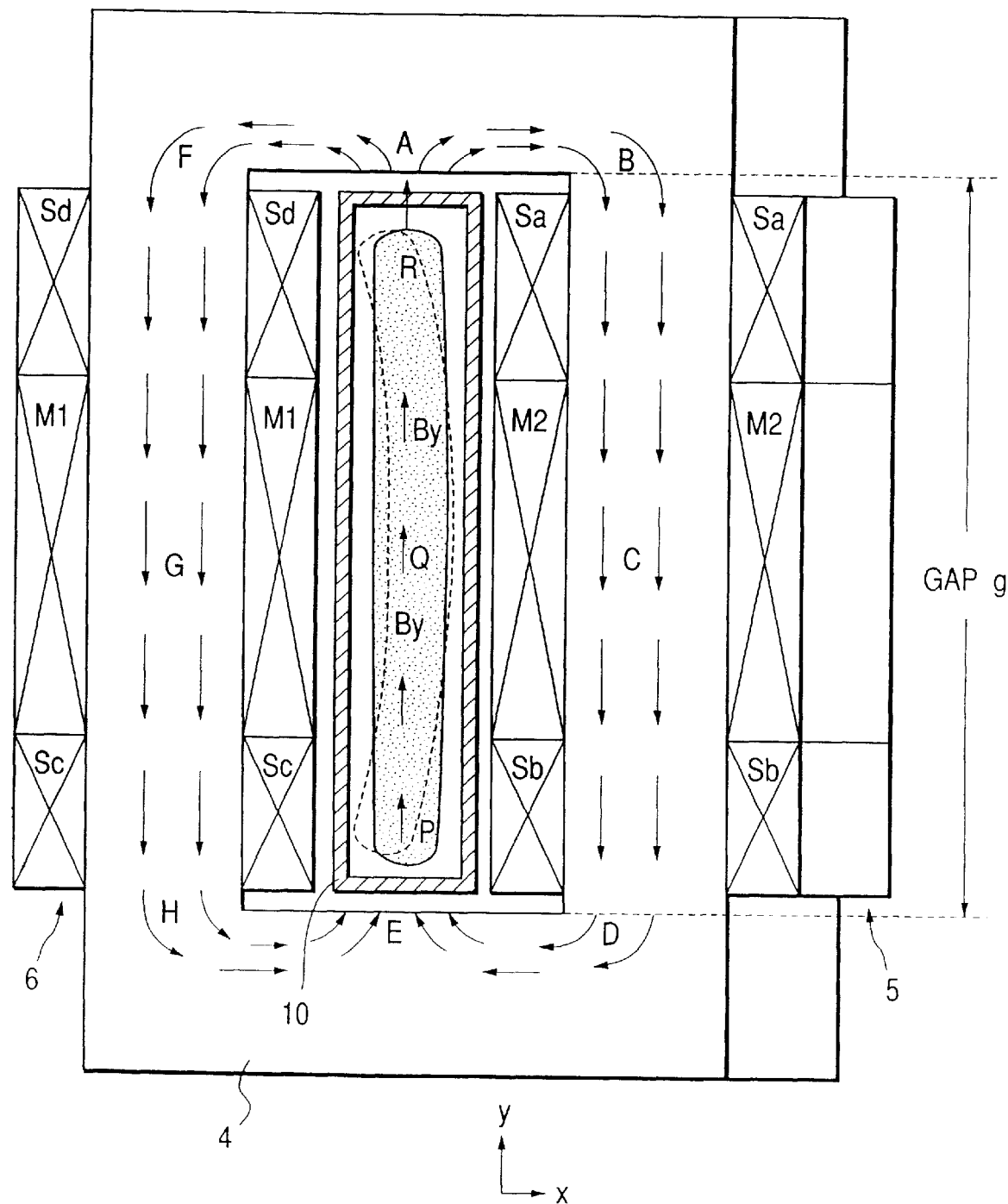
FIG. 2 is a sectional view showing coils, the shape of a yoke, the distribution of magnetic force lines, an ion beam, etc. in a section of a deflection magnet perpendicular to the direction of movement of the beam.

4. FIG. 2 shows a view of the xy section of the magnet. The beam advances in a vacuum whereas the yoke is in the air. A housing 10 for keeping the vacuum is provided so that the beam comes flying in the housing 10. The yoke 4 is formed of a cylindrical ferromagnetic material which is curved largely. Because the z-axis is taken along the curve, the z-axis is a curved coordinate. If the yoke is extended along the z-axis, the yoke becomes a rectangular-pipe-like body. If the yoke is cut along a section (xy) perpendicular to the z-axis, a section shaped like a frame of a quadrilateral is obtained. While attention is paid on the sectional shape, the sectional shape is called "window frame type". The xy section of the yoke is shaped like a frame, and the yoke is extended long in a direction (z-direction) perpendicular to the xy section. The yoke is not only extended but also curved.

A plurality of inner coils 6 are wound horizontally (in the xz plane) on the inner curved frame. A plurality of outer coils 6 are wound horizontally (in the xz plane) on the outer curved frame. There is characteristic in that a plurality of coils are disposed in the longitudinal direction of the beam.

Further, attention must be paid on the direction of the coil current. If a closed magnetic circuit is formed in a rectangular yoke, the coils are wound so that a magnetic field is generated in the same flow direction. The present invention, however, does not aim at forming such a closed magnetic circuit, but aims to generate magnetic fields in reverse directions and make them collide with each other in the center portion so that a magnetic force line distribution to draw out an intensive magnetic field to the outside i formed. Hence, the product (AT) of current and winding number is required to be large. Not only the value of AT is required to be large but also the magnetic flux density $B_y$ is required to be uniform in the longitudinal direction of the beam.

The inner coils 5 are composed of three types of coils separated vertically. A main coil M2 is provided in the center portion. A sub-coil Sa is provided above the main coil M2 and a sub-coil Sb is provided below the main coil M2. Each of the coils is wound in the xy plane. The coils Sa+M2+Sb form the inner coils 5. Currents can be changed individually. The combination of the two sub-coils Sa and Sb will be referred to as "Sub2". That is, Sub2 is equal to Sa+Sb.

Also the outer coils 6 are composed of three types of coils separated vertically. A main coil M1 is provided in the center portion. A sub-coil Sd is provided above the main coil M1 and a sub-coil Sc is provided below the main coil M1. Each of the coils is wound in the xz plane. The coils Sc+M1+Sd form the outer coils 6. Currents can be changed individually. The combination of the two sub-coils Sc and Sd will be referred to as "Sub1". That is, Sub1 is equal to Sc+Sd.

If a closed magnetic circuit is formed in the inside of the yoke, currents are made to flow in the inner and outer coils so that the directions of the currents are reversed to each other to add up magnetic flux in the yoke. In the present invention, however, the directions of the currents are reversed to each other. Magnetic flux in the two frame portions of the U-shaped yoke is designed to be aligned in one and the same direction when the directions of the currents are identical with each other. In the right frame, downward magnetic flux as represented by B, C and D is formed. In the left frame, downward magnetic flux as represented by F, G and H is formed. The magnetic flux BCD and the magnetic flux FGH aligned in one and the same direction collide with each other in the center portion E of the frame of the yoke and come out of the yoke. This generates a magnetic field $B_y$ (PQR) in the gap. The right magnetic circuit ABCDE is given by the current-winding number product (AT) in the coils wound on the left frame. The magnetic field, however, goes into and out of the magnetic material through space, so that leaking magnetic field occurs in the curved portions AB, DE, EH and FA. If the number of coils is one, $B_y$ between A and E is hardly kept in the y-direction. If only the main coils M1 and M2 are provided, the magnetic field is leaked from portions which are not covered with the coils. Because of the leakage, the magnetic field $B_y$ in a neighbor of the center point Q (y=0) becomes intensive and the magnetic field $B_y$ in portions of the two end points P and R (y=±h) becomes weak.

Therefore, coils Sa, Sb, Sc and Sd for correction of dipole magnetic field are added to opposite sides of the main dipole coils M1 and M2. The leaking magnetic field in the opposite end portions (P and R) can be substantially completely eliminated by means of these coils. Further, when such six coils are provided, controllability is enhanced because the degree of freedom in current selection increases. Because the number of coils is large; magnetic flux can be intensified as a whole. In FIG. 2, the function of the main coils and sub-coils for generating a magnetic field will be described below more in detail.

Operation of the Magnetic Field

1. By selection of the ampere-turn values of the sub-coils and main coils, the distribution of the magnetic field in the horizontal direction $B_y$ (x,y) (x-direction) in the lengthwise-direction position (y) can be changed. The main coils are formed of M1 and M2, and current-winding number products (AT) can be given to the main coils M1 and M2 individually. If the AT in the right main coil M1 is selected to be larger then the AT in the left main coil M2, an x-direction gradient of the lengthwise-direction magnetic field $B_y$ is formed in a neighbor of the point Q so that the $B_y$ in a position near M1 becomes larger. That is, the relation $\delta B_y/\delta x > 0$ is established. If the AT in the right main coil M1 is selected to be smaller than the AT in the left main coil M2, the gradient of the magnetic field is reversed. Although this shows the anisotropy of the magnetic field in a neighbor of the point Q, a magnetic field gradient can be formed at the point R when the AT in the sub-coil Sd and the AT in the sub-coil Sa are selected to be not equal to each other. If the current-winding number product (AT) in the sub-coil Sc and the AT in the sub-coil Sd are selected to be not equal to each other, a gradient $\delta B_y/\delta x$ can be formed at the point P. In this manner, an x-direction gradient can be formed in accordance with the combinations of AT in M1 and M2, in Sd and Sa and in Sc and Sb.

Figure 3A:
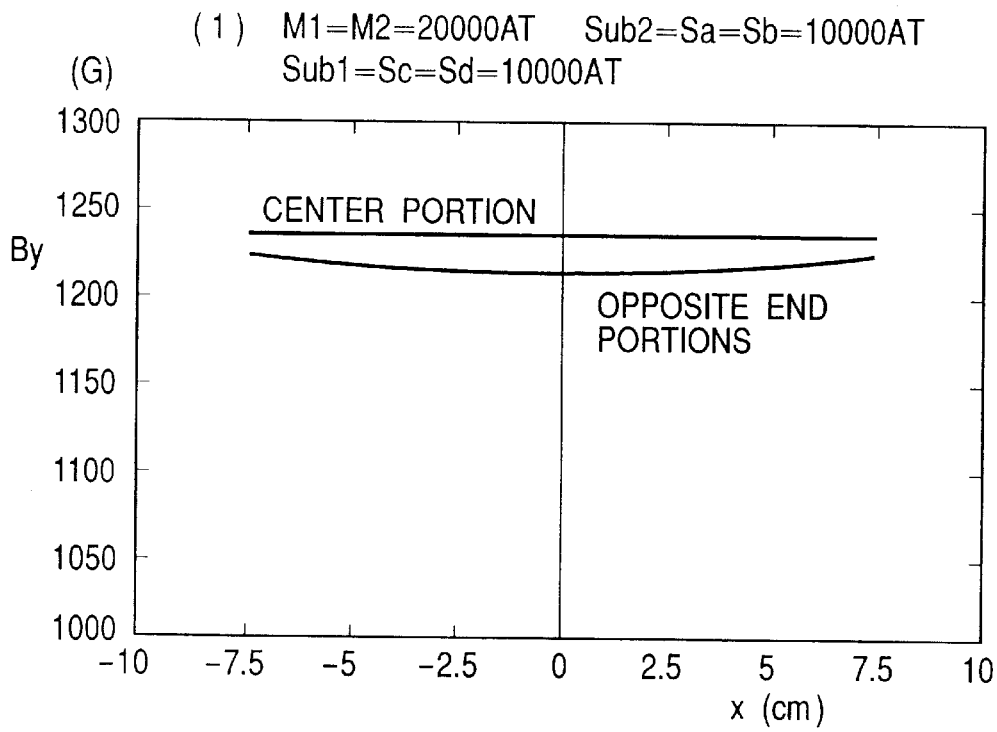
FIGS. 3A and 3B are graphs showing the fact that the x-direction distribution of the magnetic field $B_y$ can be changed by changing the current-winding number products of the main coils and sub-coils, in which abscissa axis shows an x-coordinate and the ordinate axis shows the intensity of the magnetic field $B_y$, FIG. 3A showing the case where the current-winding number products M1 and M2 in the main coils are M1=M2=20000 AT, the current-winding number products Sa and Sb in the sub-coils are Sub2=Sa=Sb=10000 AT, and the current-winding number products Sc and Sd in the sub-coils are Sub1=Sc=Sd=10000 AT, in which $B_y$ is substantially constant and uniform both in the left and in the right, FIG. 3B showing the case where the current-winding number products M1 and M2 in the main coils are M1=M2=20000 AT, the current-winding number products Sa and Sb in the sub-coils are Sub2=Sa=Sb=12000 AT, and the current-winding number products Sc and Sd in the-coils are Sub1=Sc=Sd=8000 AT, in which values of $B_y$ in the opposite end portions in which the sub-coils are present, are different from each other in accordance with the difference between the current-winding number products.
Figure 3B:
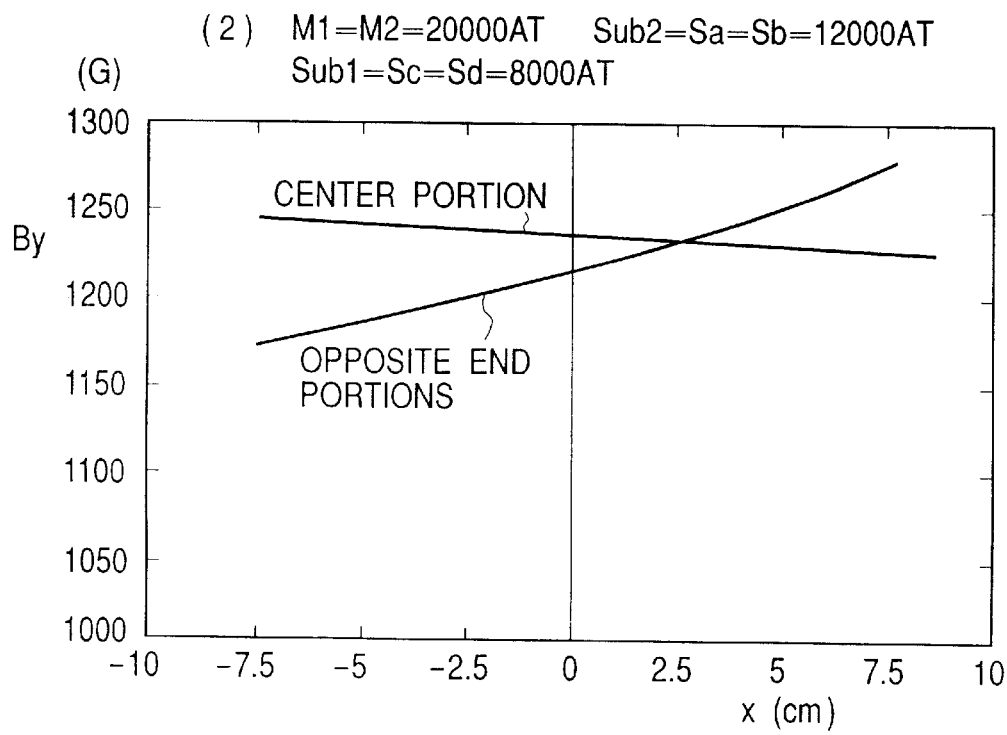

2. FIGS. 3A and 3B show that the horizontal-direction inclination of the magnetic field varies in accordance with the height in the gap on the basis of the amper-turn values (AT) of the sub-coils and the main coils. In FIG. 3(2), the current-winding number product in each of the main coils M1 and M2 is 20000 AT, the current-winding number product in each of the right sub-coils Sa and Sb is 12000 AT, and the current-winding number product in each of the left sub-coils Sd and Sc is 8000 AT. The abscissa axis shows the distance from the center in the horizontal directions (x-direction) perpendicular to the direction (z-direction) of the movement of the beam. Because the lateral width of the yoke is 20 cm, the change of the magnetic field $B_y$ in the range of ±10 cm from the center becomes a subject of discussion. The ordinate axis shows the value (gauss, G: 10 kG=1 tesla) of the vertical magnetic field $B_y$ in the x-position. When there is such asymmetry between the current-winding number products in the sub-coils, the magnetic field $B_y$ in the opposite end portions P and R has remarkable asymmetry. The magnetic field $B_y$ is weak (1170 G) in the left and intensive (1280 G) in the right. This is a matter of course because the current-winding number product in the left sub-coils is smaller than the current-winding number product in the right sub-coils. A slight inclination in the reverse direction occurs at the point Q of the center portion.

If the current-winding number product in the main coil M1 is different from the current-winding number product in the main coil M2, the inclination $\delta B_y/\delta x$ of $B_y$ occurs also at the point Q of the center portion. When the current-winding number products in left and right coils opposite to each other are made to disagree with each other as described above, a horizontal gradient can be generated.

FIG. 3A shows the x-direction (horizontal) change of the magnetic field $B_y$ in the center portions (point Q) and in the opposite end portions (points P and R) in the case where the current-winding number product in each of the main coils M1 and M2 is 20000 AT and the current-winding number product in each of the sub-coils Sa to Sd is 10000 AT. The magnetic field $B_y$ at the point Q of the center portion little changes in the x-direction. It is kept about 1230 gauss. The magnetic field $B_y$ in each of the opposite end portions is substantially constant (1215 to 1220 gauss) in the x-direction, but has a tendency to increase a little as the position approaches the yoke. In this manner, the x-direction gradient of $B_y$ can be controlled when the AT values of the main coils and sub-coils are balanced.

This inclination $\delta B_y/\delta x$ is called "field index". The beam can be converged or diverged in the x-direction in accordance with the value of the field index. Because the beam is long in one direction and narrow in the x-direction, the convergence/divergence in the x-direction intensively affects the effective width of the beam. If the width of the beam fluctuates in the x-direction, the density of the beam incident to the wafer may fluctuate undesirably. To avoid this phenomenon, it is necessary to reduce the inclination $\delta B_y/\delta x$.

3. Also the gradient $\delta B_y/\delta y$ of the magnetic field $B_y$ in the lengthwise direction can be controlled when the balance of the current-winding number products in the main coils and sub-coils is adjusted. If the AT in the upper coils Sa and Sd is selected to be larger than the AT in the lower coils Sc and Sb, the relation $\delta B_y/\delta y>0$ can be established. The value of $B_y$ affects the curvature of the locus of the beam curve. If the relation $\delta B_y/\delta y\ne 0$ is valid, the section of the beam is distorted into a diamond-shape because the one-directionally long beam is curved intensively in the upper portion and curved weakly in the lower portion. If the relation $\delta B_y/\delta y=0$ is valid, the center line of the curve is always on one cylindrical surface because the curvature of the curve is equalized at any point in the lengthwise direction. That is, it is necessary to reduce the y-direction gradient $\delta B_y/\delta y$.

Figure 20A:
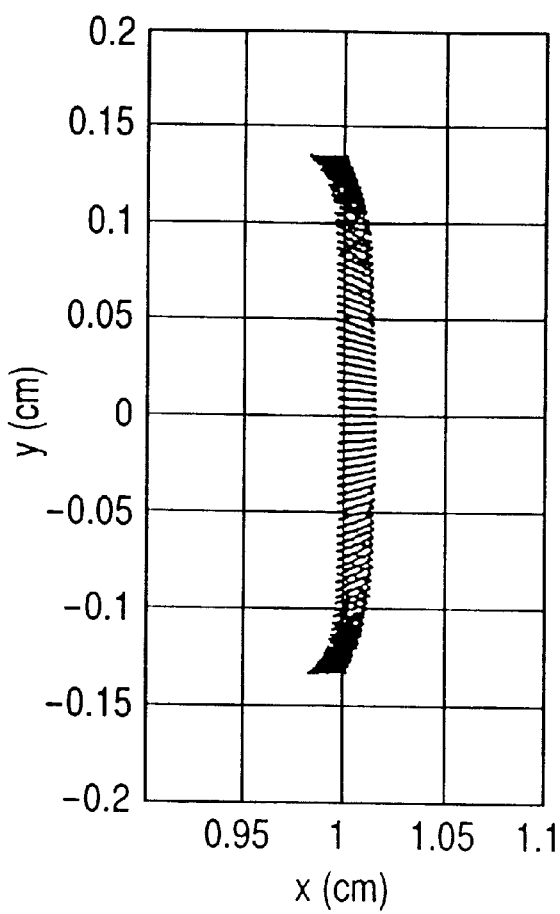
FIGS. 20A and 20B are graphs showing how the uniformity of the beam changes in accordance with the adjustment of the current-winding number products in the main coils and sub-coils, in which the current-winding number products of the inner coil is the same as that of the outer coil.
Figure 20B:
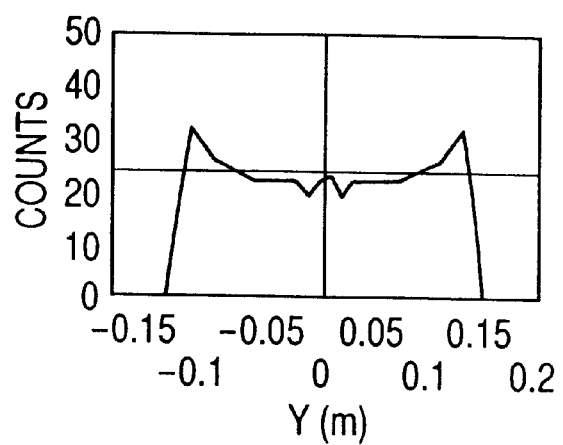
Figure 20C:
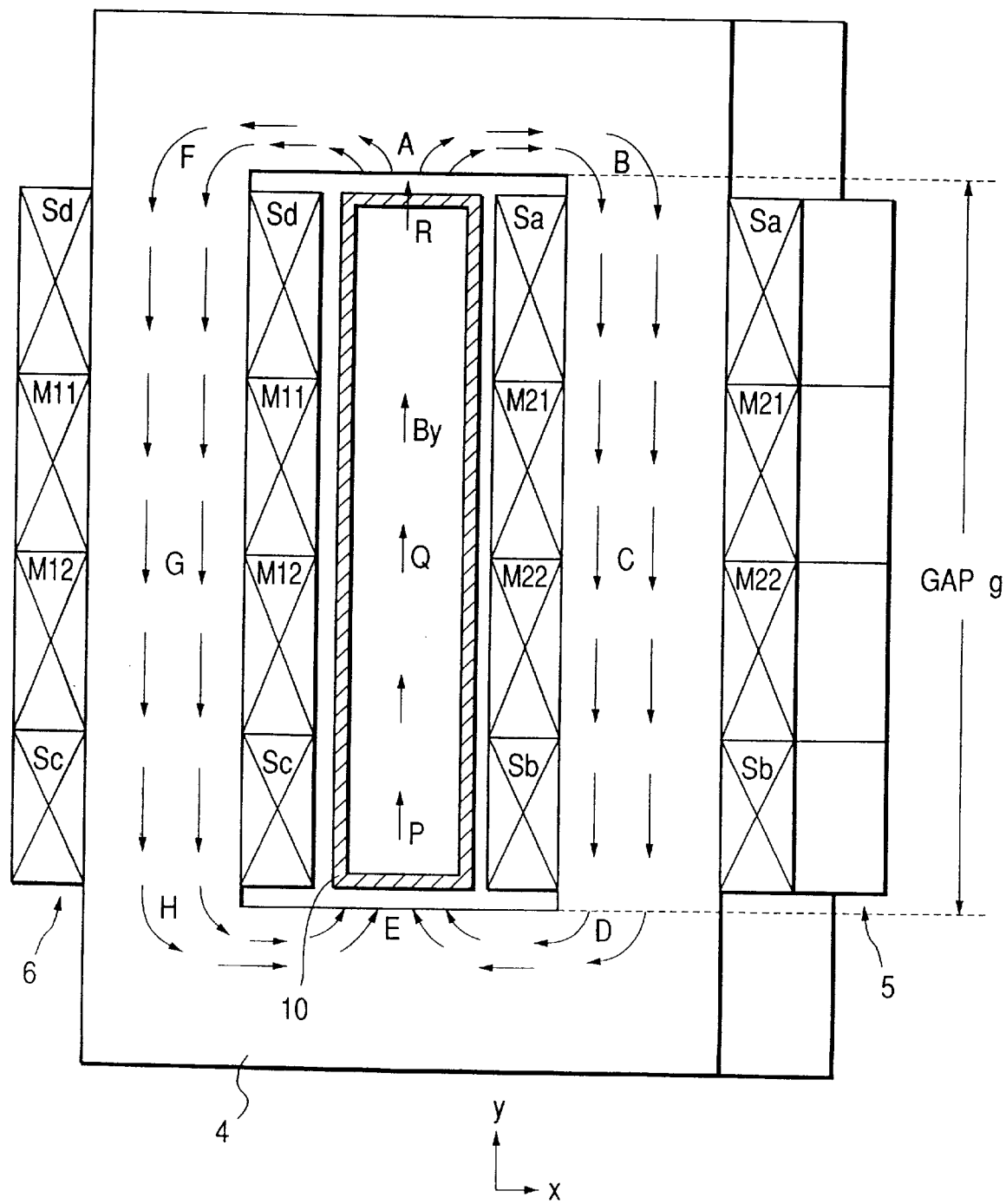
FIG. 20C is a sectional view showing coils, the shape of a yoke, the distribution of magnetic force lines, an ion beam, etc. in a section of a deflection magnet perpendicular to the direction of movement of the beam and, which are used for obtaining results shown in FIGS. 20A, 20B, 21A and 21B.
Figure 21A:
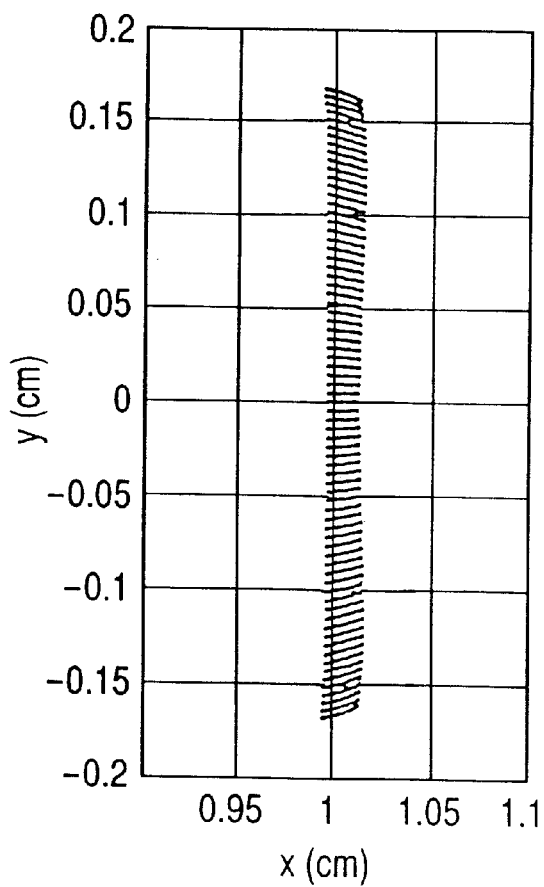
FIGS. 21A and 21B are graphs showing how the uniformity of the beam changes in accordance with the adjustment of the current-winding number products in the main coils and sub-coil, in which the current-wind number products of the inner coil is different from that of the outer coil.
Figure 21B:
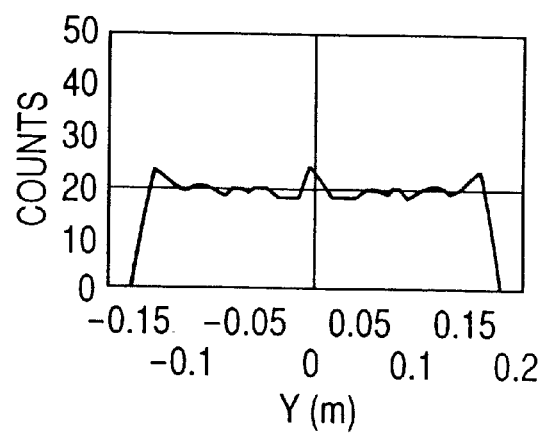

Here is shown how the uniformity of the beam changes in accordance with the adjustment of the current-winding number products in the main coils and sub-coils. As shown in FIGS. 20A and 20B, used is an accompanying graph of data of beam controlled by means of a magnet. When the current-winding number products in the main coils and sub-coils have the same value, the center portion in the distribution of the beam in the longitudinal direction of the beam is low. Incidentally, values integrated in the direction of the width of the beam are used in this distribution. Specifically, in this case, used coils are shown in FIG. 20C which is slightly different from the coils shown in FIG. 2. In the case of FIGS. 21A and 21B, the same AT value (15000 AT/coil) is given to the inner coils (Sa-M21-M22-Sb) and outer coils (Sd-M11-M12-Sc). As shown in FIGS. 21A and 21B, it is shown that the distribution of the beam becomes uniform when the balance of the current-winding number products is changed. In this example, the ratio of the current-winding number product in the inner coils to the current-winding number product in the outer coils is about 1.5. When the coils are controlled individually as described above, the uniformity of the beam distribution can be controlled. Specifically, in this case, used coils are shown in FIG. 20C. In the case of FIGS. 21A and 21B, the AT values given to the respective coils are: the inner coils (M21–M22): 14520 AT/coil, the inner coils (Sa–Sb): 14819 AT/coil, the outer coils (M11–M12): 21780 AT/coil, and the outer coils (Sd–Sc: 22220 At/coil.

4. Incidentally, a question in such a magnet having a large gap g is whether the magnetic field in the yoke is unsaturated or not. The long gap g is composed of air having magnetic permeability of 1. The yoke is formed from a ferromagnetic material of high magnetic permeability. The magnetic flux $\theta$ is continuous along a magnetic circuit. The magnetic flux density B has a relation $B=\mu H$ with the magnetic field H. Although $\mu$ in a vacuum is 1, $\mu$ in the yoke reaches from about 100 to about 10000. When dS is an element of a plane where the magnetic flux crosses, the relation $\int BdS=\Phi$ is established continuously. Accordingly, if the value of B in the vacuum gap PQR is 1000 gauss, also the value of H is substantially equal to B. In the yoke, the value of H becomes sufficiently small. A value obtained by integrating H along the path s is At ($AT=\int Hds$). A large part of the current-winding number product AT is used in the vacuum portion PQR. The sectional area of the vacuum magnetic circuit PRQ of the gap is small whereas the sectional area of the yoke 4 of a ferromagnetic material is considerably large. Because the magnetic flux $\Phi$ is continuous in the closed path, the magnetic flux density B in the yoke 4 of a ferromagnetic material is no more than several times as much as the magnetic flux density B in a vacuum.

5. For example, the magnetic field necessary for bending arsenic ions accelerated to 20 keV into a circular beam having a radius of curvature of 1 m is about 2 kG. Because the magnetic field in space is 2 kG, the magnetic flux density in the yoke is only several kG. A general ferromagnetic material such as ferrite, or the like, is not saturated when the magnetic flux density has the aforementioned value. Accordingly, there is no problem in saturation. Arsenic ions are heavy ions. Arsenic, phosphorus and boron ions are preferably used in the present invention. In most cases, a lighter element than arsenic is injected by means of a general ion injection apparatus. Further, with respect to acceleration energy, larger energy may be used in the ion injection apparatus. In the present invention which aims at low-energy ion injection, however, 20 keV is substantially an upper limit. As described preliminarily, use of low-energy ion beam is for the purposes of: preventing charging-up for occurring; preventing a grating structure from being damaged; etc.

6. The reason why the magnetic field in the yoke can be reduced in the present invention is in that the required magnetic field B in the gap can be reduced because the radius of deflection of the beam is considerably large so that the energy of the beam is low. The magnetic flux density B necessary for making an ion beam of mass M, electric charge q and acceleration voltage V run in the magnetic field so as to draw a circle with a radius R is given as follows.

$$B=(MqV)^{1/2}/0.69\,R \qquad (1)$$

When the radius R of the locus of the curve in the magnet is large and the acceleration voltage V is small as shown in the present invention, the magnetic flux density B in a vacuum becomes weak. Even if the energy is constant, the magnetic flux density B necessary for an ion beam smaller in mass M becomes weak. Although the aforementioned evaluation has been made upon an arsenic beam of 20 keV, ions to be injected are, in most cases, lighter than arsenic ions and the energy qV is, in most cases, smaller than the energy of the arsenic beam.

7. Incidentally, in the case of a magnet used in the field of accelerators, the magnetic field is so intensive that the magnetic field intensity is of the order of tesla (1 tesla–10 kG). This is because the acceleration voltage V is very large. Because an ordinary conducting magnet cannot generates such an intensive magnetic field, a superconducting magnet is used. The accelerator cannot be used industrially because equipment for the accelerator is expensive and large-scaled. In the present invention, the magnetic flux density B having an extremely smaller value than the magnetic flux density in the accelerator can be used sufficiently.

8. In the preliminarily-described known literature 4̂ "High Precision Superconducting Magnets", IEEE Transactions on Nuclear Science, vol, NS-24, No. 3 (1977) 1299 and 5̂ "Large Aperture Superconducting Magnet (BENKEI)", Cryogenics February (1984) 83, coils are wound on the inner side of the yoke. In the present invention, coils are wound on left and right parts of the yoke. In this respect, the yoke structure and coil structure in the present invention are different from those in coils used in these known magnets.

9. In the present invention, a plurality of coils are disposed individually in the left and right of a frame-type yoke as described above to thereby generate a magnetic field $B_y$ in a vacuum gap so that the x-direction distribution and y-direction distribution of the magnetic field can be changed freely. The above description has been made upon a question in the distribution of $B_y$ in the xy plane perpendicular to the direction of movement of the beam. Next, the distribution of the magnetic field $B_y$ in the direction (z-direction) of movement of the beam is required to become a subject of discussion.

10. In a magnet in which the gap g of the yoke is large, the effective magnetic circuit length $L_{eff}$ must be calculated while the leaking magnetic field in the z-direction is taken into consideration. In the present invention, the length of the yoke is not equal to the effective magnetic circuit length $L_{eff}$ because the gap g in the magnet is large. The terminology "magnetic circuit length" used herein means an effective spread of the magnetic field in the direction of movement of the beam. When the integrated value of the magnetic flux density along the path is equal to that in the ideal case where constant magnetic flux density $B_0$ is present in $L_{eff}$ but magnetic flux in the other range is zero, $L_{eff}$ is called "effective magnetic circuit length".

Figure 4:
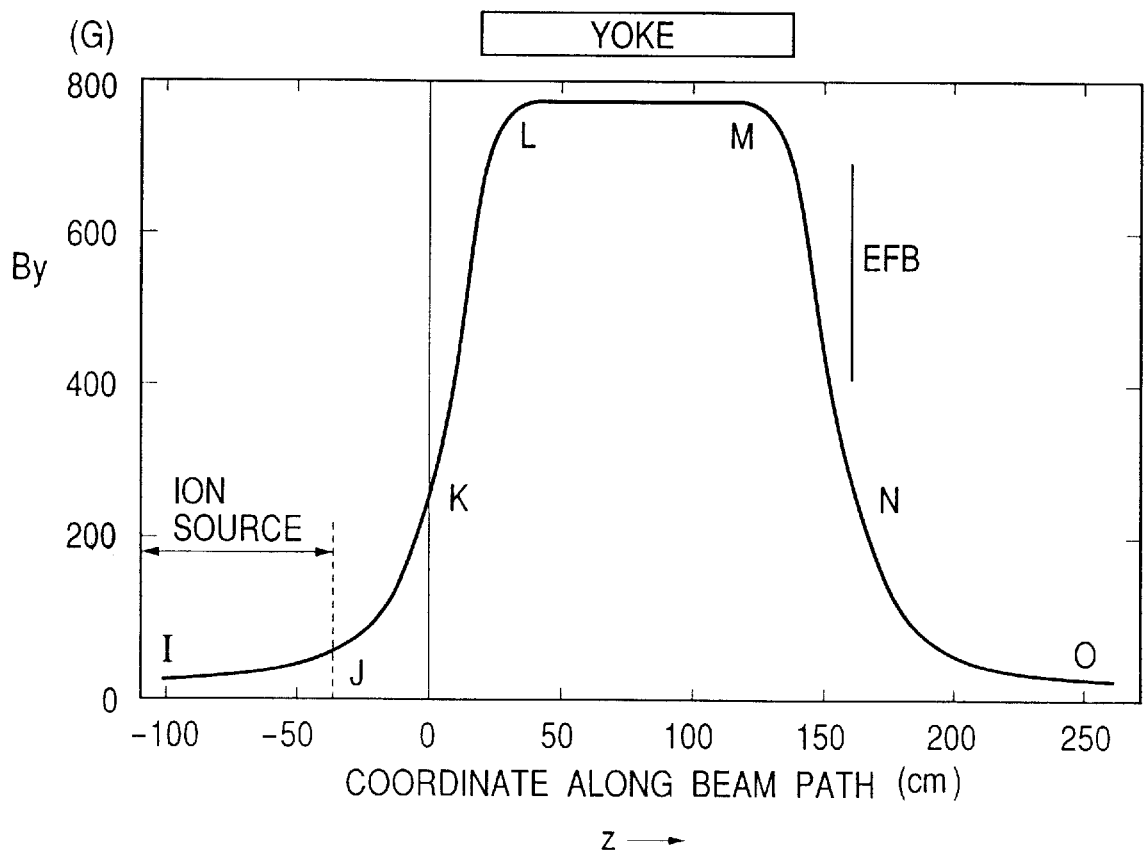
FIG. 4 is a graph showing the change of the magnetic field $B_y(0, 0, z)$ along the beam path (z-axis) in the case where the ion source is not covered with any magnetic shield, in which the abscissa axis shows a z-coordinate and a coordinate value along the path, and the ordinate axis shows $B_y$ (gauss)

11. FIG. 4 shows the distribution of magnetic field along the direction (z-direction) of movement of the beam. The abscissa axis shows the value of the z-coordinate (cm) taken so as to be curved in the direction of movement of the beam when a position slightly in front of an inlet of the yoke is expressed as z=0. Although the beam actually moves along the curved path, the path is shown in the extended state in FIG. 4. The ordinate axis shows the magnetic field $B_y$ (gauss). The ion source is disposed between I and J in the case where the ion source is not shielded. A slight value of $B_y$ is present at the point J of the outlet of the ion source. The yoke is disposed between L and M. The magnetic flux density $B_y$ rises in space JL in the yoke from the ion source. $B_y$ decreases in a range of from the yoke to the subject O. A value obtained by integrating $B_y$ along the path and dividing the integrated value by predetermined magnetic field $B_{y0}$ is the effective magnetic circuit length $L_{eff}$.

Here, the length KN is the effective magnetic circuit length. The initial position K in the effective magnetic circuit length KN is taken as z=0. The length LM of the yoke is shorter than the effective magnetic circuit length KN. A value obtained by dividing the length $L_{eff}$ of the effective magnetic circuit length KN by the radius R of the curve gives the center angle θ of the curve. The present invention is designed so that mass spectrometric analysis is performed on the basis of an intensive curve in which the curved angle θ is about 90°. Even in the case where the curved angle θ is 90°, the center angle of the yoke is smaller than 90°. It can be thought of in a simplified manner that the beam is bent with the radius R in a range of the effective magnetic circuit length $L_{eff}$ and the beam moves straight in the other range.

Figure 5:
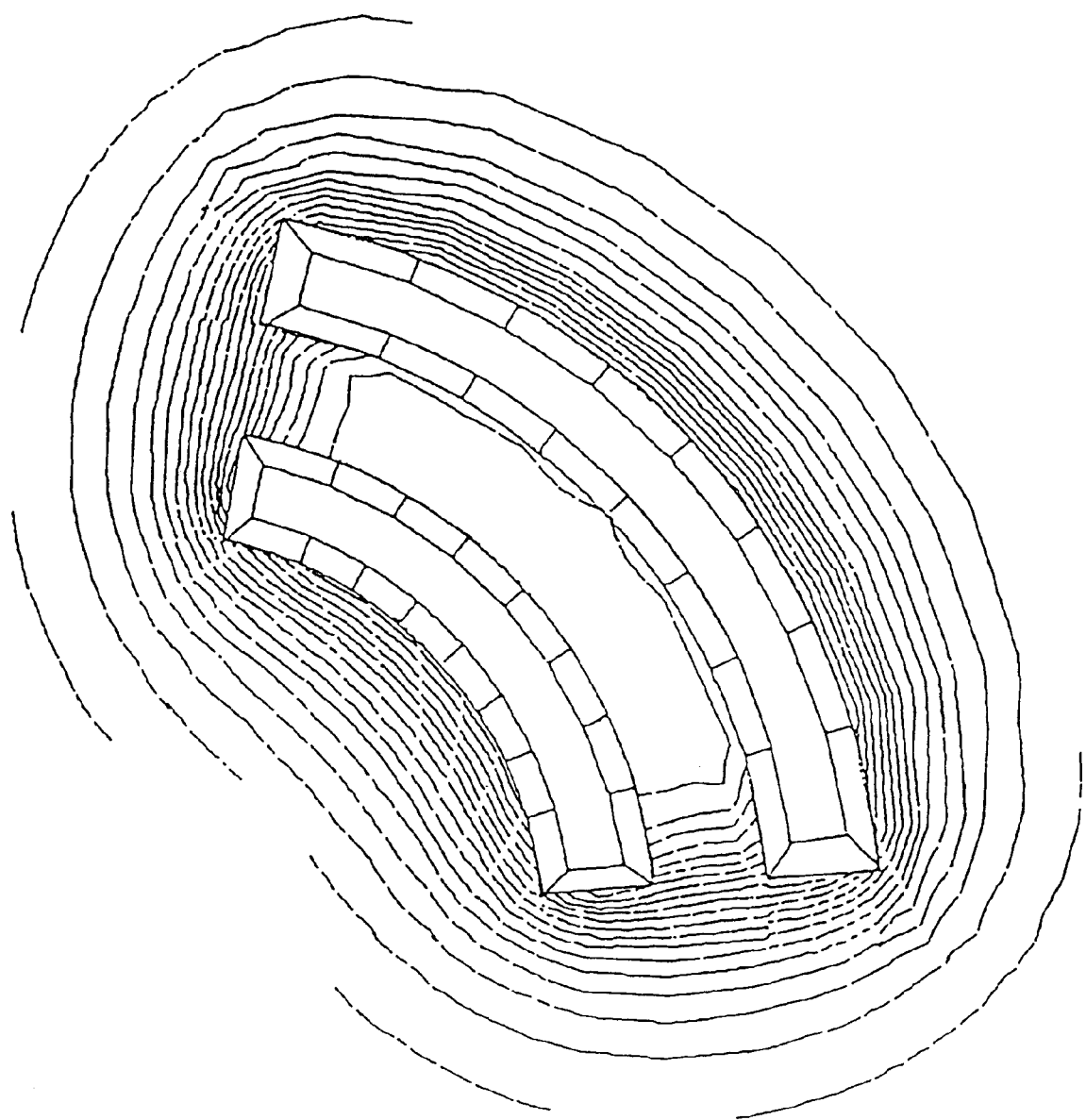
FIG. 5 is a graph showing the distribution of contour lines $B_y$=const of the magnetic field $B_y$ around the yoke in the xz plane containing the beam path and perpendicular to the magnetic field in the case where the ion source is not covered with any magnetic shield.

12. FIG. 5 shows an example of the contour line distribution of the magnetic field $B_y$ on the xz plane in the center (y=0) of the yoke. When the magnetic field is constant, that is, $B_y(x,y,z)=c$, a continuous surface of x, y and z is given because the magnetic field $B_y(x,y,z)$ is a variable which changes in three-dimensional space. If the surface is cut by a plane y=0, a curve on the xz plane is obtained. When the constant c is changed little by little, a group of contour lines are obtained. The view drawn in the aforementioned manner is FIG. 5. The yoke is expressed as a curved circular arc. In the outside of the yoke, $B_y$ decreases gradually. This is a matter of course. It is an important matter that $B_y$ is substantially constant in a portion between two parts of the yoke. There is no contour line in a portion between the two parts of the yoke. This is a portion in which the maximum value of $B_y$ is given. This portion is equivalent to the portion between L and M in FIG. 4. The contour line group in front of this portion is equivalent to the portion IJKL in FIG. 4. The contour line group in rear of this portion is equivalent to the portion MNO in FIG. 4.

In FIG. 5, there are few contour lines in the yoke. This phenomenon shows that $B_y$ in the yoke is constant not only in the center line (x=0) of the locus of the beam but also in a portion (x≠0) slightly far from the center line. It is also important that $B_y$ is constant in the x-direction because the beam is a beam having a one-directionally long section with a width in the x-direction (herein, about 5 cm) as shown in FIG. 2.

13. In FIG. 5, consideration is made such that the angle between end surfaces of the magnet yoke is not always 90° but the angle of the effective magnetic circuit length corresponds to 90° in view of the leaking magnetic field. The center angle of the curve of the yoke is smaller than 90°. This fact was described above with reference to FIG. 4.

14. The effective magnetic circuit length is obtained as follows.

$$L_{eff} = \int B_y(0,0,z)dz/B_0 \tag{2}$$

in which z is a linear coordinate taken along the yoke center line (x=0). B(0,0,z) means a value in the center x=0, y=0 of the xy section. The range of integration of z is from a negative infinite value to a positive infinite value. $B_0$ is a predetermined magnetic field as the base of the curve expression (1) in calculation.

Magnetic Shield

Figure 6:
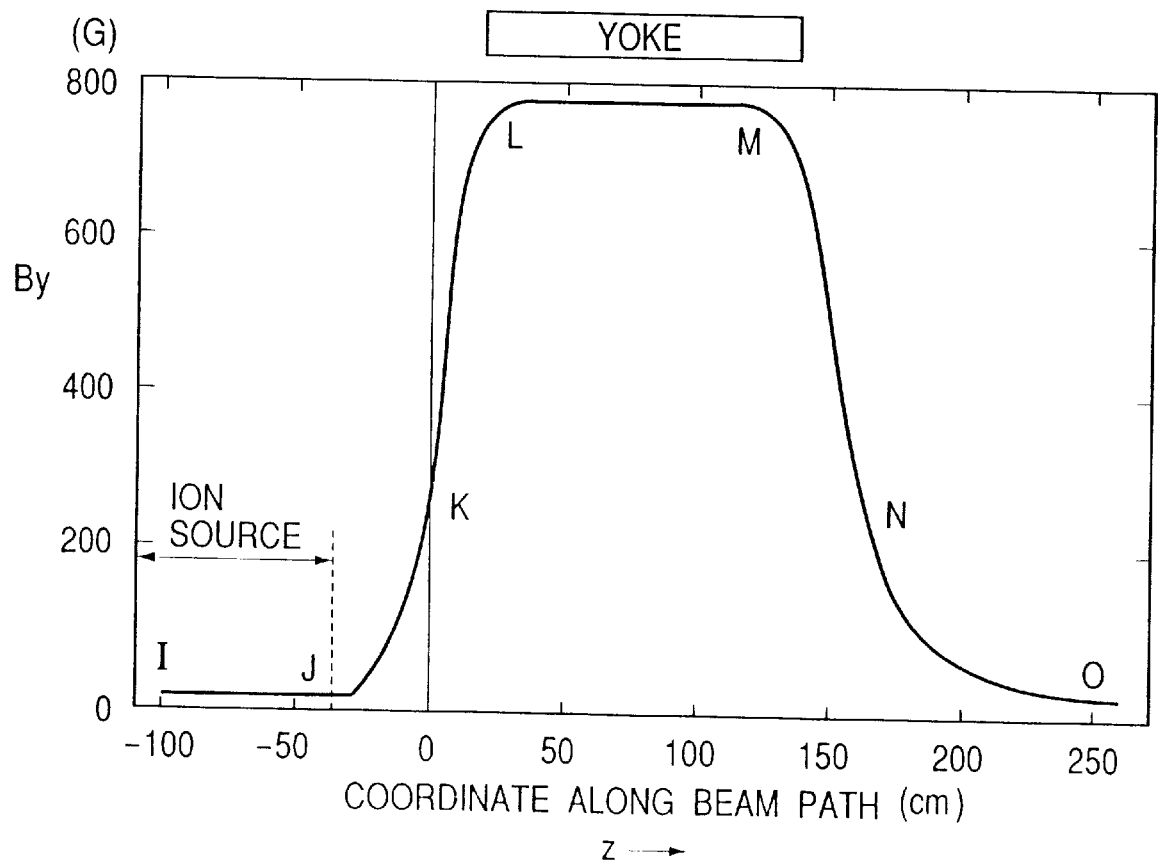
FIG. 6 is a graph showing the change of the magnetic field $B_y(0, 0, z)$ along the beam path (z-axis) in the case where the ion source is covered with a magnetic shield. The abscissa axis shows a z-coordinate and a coordinate value along the path, in which the ordinate axis shows $B_y$ (gauss), and $B_y$ in a portion of the ion source becomes zero, because of the magnetic shield.
Figure 8:
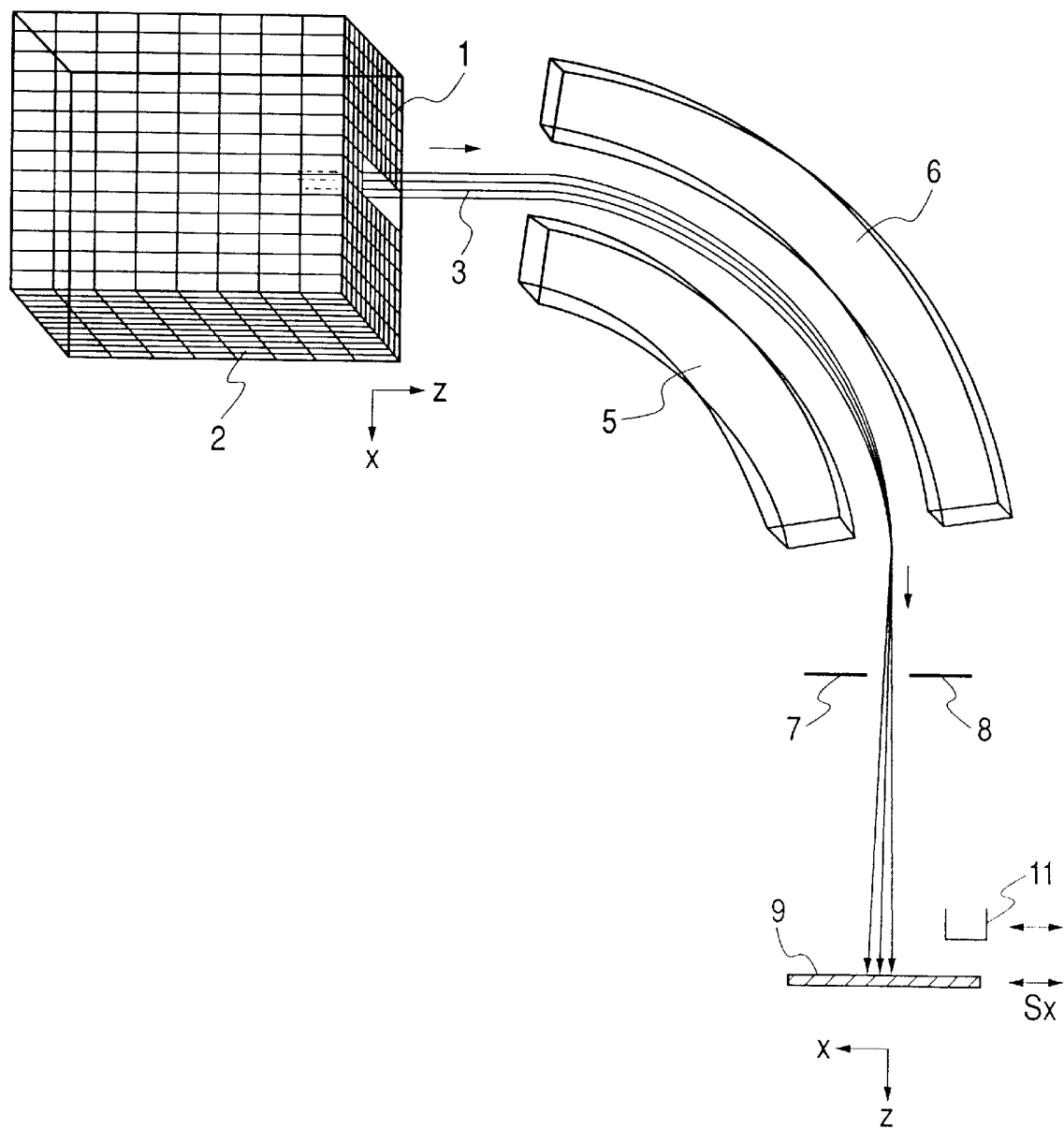
FIG. 8 is a perspective view showing the schematic configuration of an ion injection apparatus according to the present invention.

1. A further characteristic of the present invention is in that the ion source is surrounded by a magnetic shield to thereby prevent the magnetic field from entering the ion source. In FIG. 1, the magnetic shield is expressed by the broken line surrounding the ion source. In FIG. 8, the magnetic shield 2 is expressed by a grating-like cage. The magnetic shield is provided so that the ion source is free from the influence of the magnet. FIG. 6 shows the distribution of the magnetic field in the case where the magnetic shield is set. Like FIG. 4, the abscissa axis shows the z-coordinate in the direction of movement of the beam, and the ordinate axis show $B_y$. It is apparent from FIG. 6 that $B_y=0$ is established in the ion source IJ compared with FIG. 4 in which the magnetic shield is not set. The rising of $B_y$ becomes rapid just outside the ion source but the distribution of $B_y$ at other points is substantially equal to that in FIG. 4.

Figure 7:
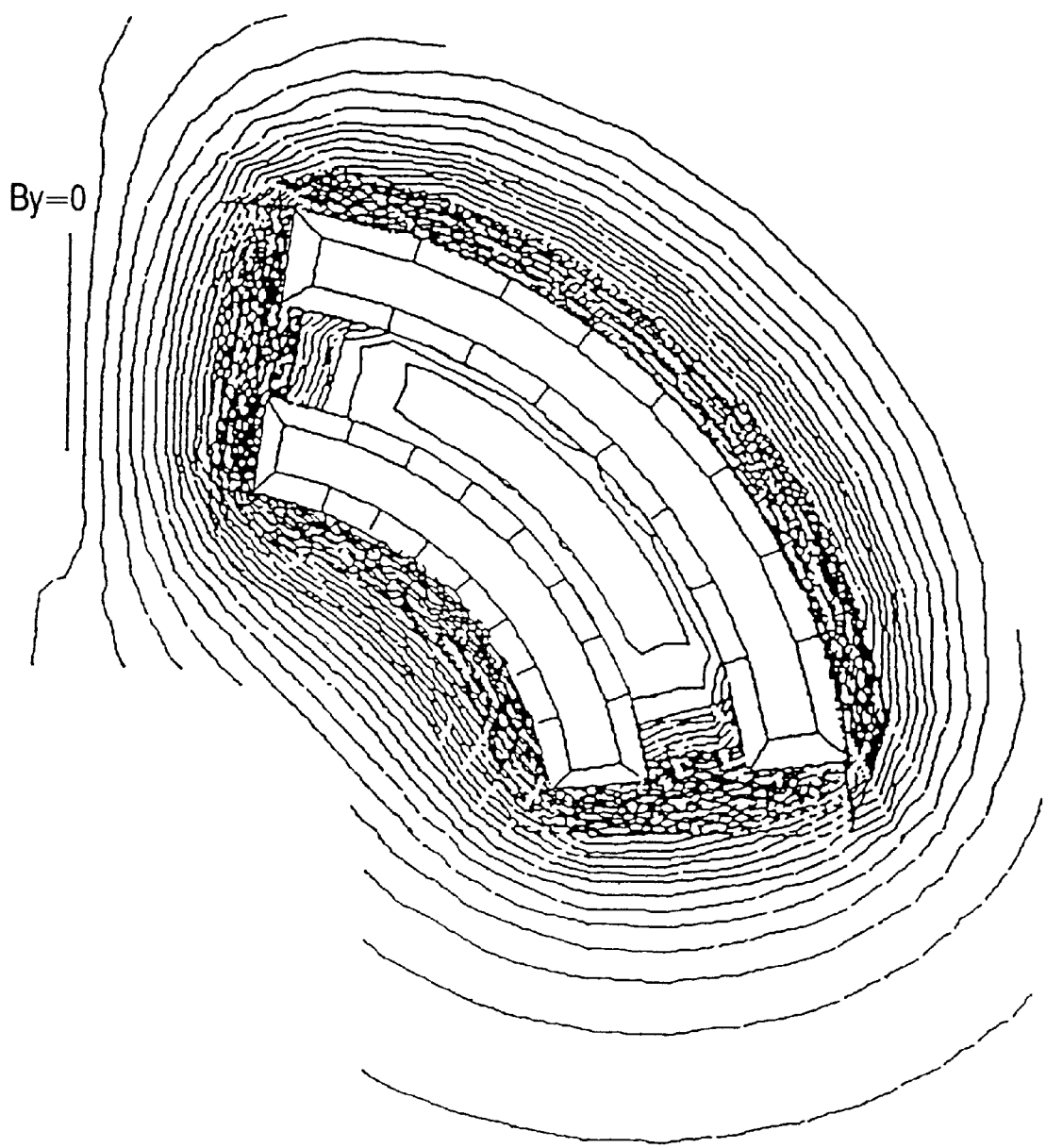
FIG. 7 is a graph showing the distribution of contour lines $B_y$=const of the magnetic field $B_y$ around the yoke in the xz plane containing the beam path and perpendicular to the magnetic field parallel with the longitudinal direction of the beam in the case where the ion source is covered with a magnetic shield.

2. FIG. 7 shows contour lines of the magnetic field $B_y$ in the case where the magnetic shield is provided. FIG. 7 is similar to FIG. 5 except the distribution of $B_y$ in a neighbor of the ion source. In the ion source, the relation $B_y=0$ is established.

3. When the magnetic shield formed of a high magnetic permeable material is set so as to surround the ion source, the magnetic field intensity in the region of the ion source can be suppressed to substantially 0 gauss. For example, the magnetic shield may be formed of a $\mu$ metal. A box having an ion beam outlet may be formed from a magnetic material as a blind patch so that the box is grounded while surrounding the ion source. The box may be provided not as a blind patch but may be provided as a mesh-like box.

4. If there is not magnetic shield, a magnetic field of the order of tens of gausses is present in the ion source. The plasma distribution of the ion source is affected by the presence of the magnetic field, so that the beam intensity distribution varies. That is, it becomes difficult to control the beam intensity distribution. To avoid this fact, it is important to provide the magnetic shield for the ion source.

Beam Track

1. FIG. 8 shows a result of pursuit as to what locus is drawn by the beam in the aforementioned magnetic field. The ion source 1 is covered with the magnetic shield 2. A one-directionally long ion beam 3 emitted from the ion source 1 moves in the z-direction and passes through space between the inner and outer coils 5 and 6 which are curved concentrically. The actually existing yoke is not shown in FIG. 8 for simplification. The beam is bent at an angle of deflection of about 90° as it is long in one direction. The beam is then passes through a one-directionally long opening of the slit plate 7 so as to strike against the subject 9. The beam strikes against the subject 9 such as an Si wafer as it is long in one directions. The length of the beam is selected to be substantially equal to the length of the subject. Accordingly, it is unnecessary to scan the subject 9 in the longitudinal direction of the beam. It is necessary only to move the subject 9 in parallel with the x-direction.

2. It is apparent that the gap g between magnets is large (for example, from 30 cm to 40 cm) but the beam is deflected accurately along the basic orbit. This is a result of the following causes: the beam emitted from the ion source is a one-directionally long belt-like beam having a regular beam sectional shape; the magnetic field $B_y$ is uniform in the xy section of the path of movement of the beam; etc.

Figure 15:
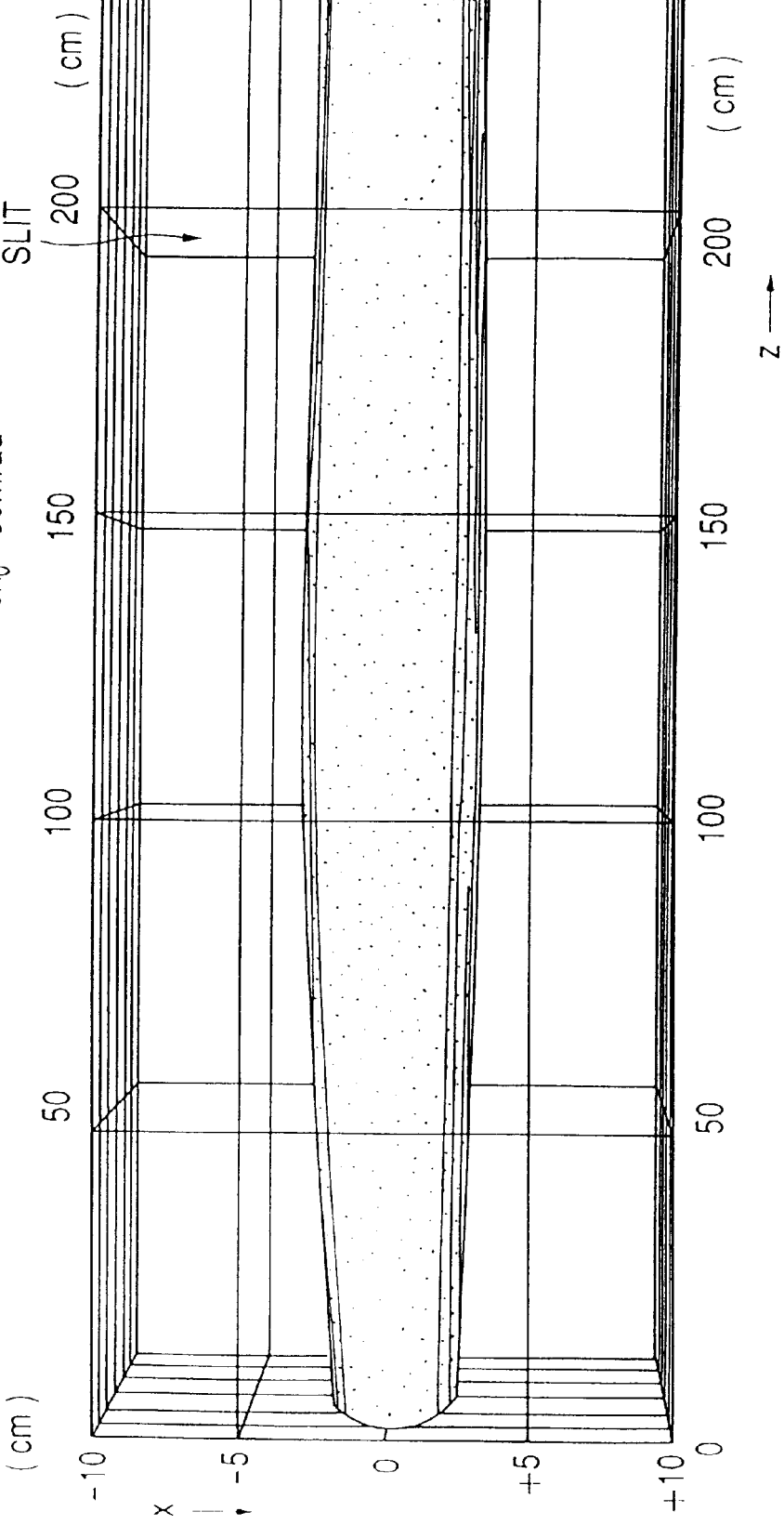
FIG. 15 is a perspective view showing the x-direction spread of a beam on a beam path in the condition that the beam curve is rearranged to a straight line in order to show how the whole of the beam changes along the beam path.
Figure 16:
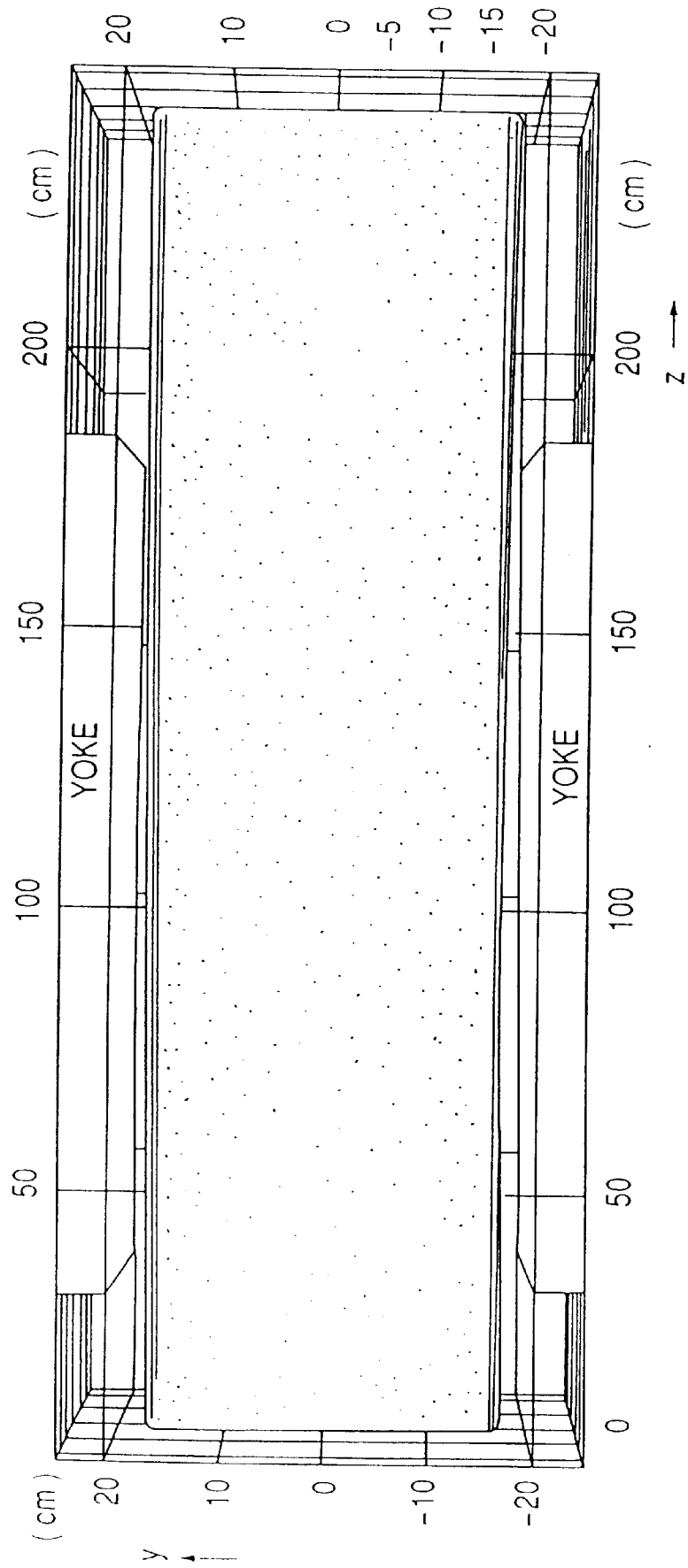
FIG. 16 is a perspective view showing the y-direction spread of a beam on a beam path in the condition that the beam curve is rearranged to a straight line in order to show how the whole of the beam changes along the beam path.
Figure 17:
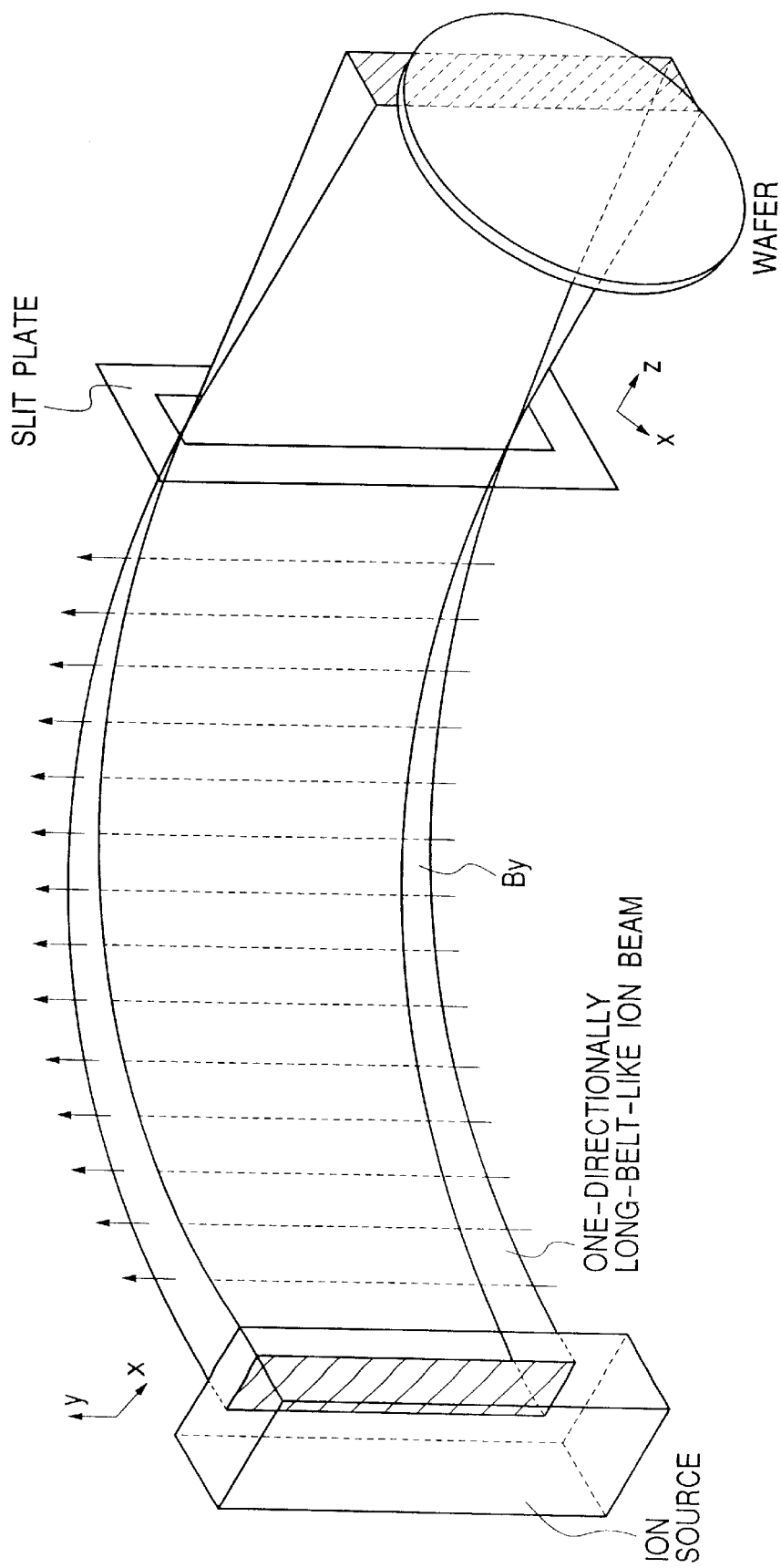
FIG. 17 is a schematic perspective view showing another example of the change of a beam according to the present invention in the case where an elongated beam is curved by a magnet, once converged to pass through a long hole, subjected to mass spectrometric analysis and then radiated onto a subject.
Figure 18:
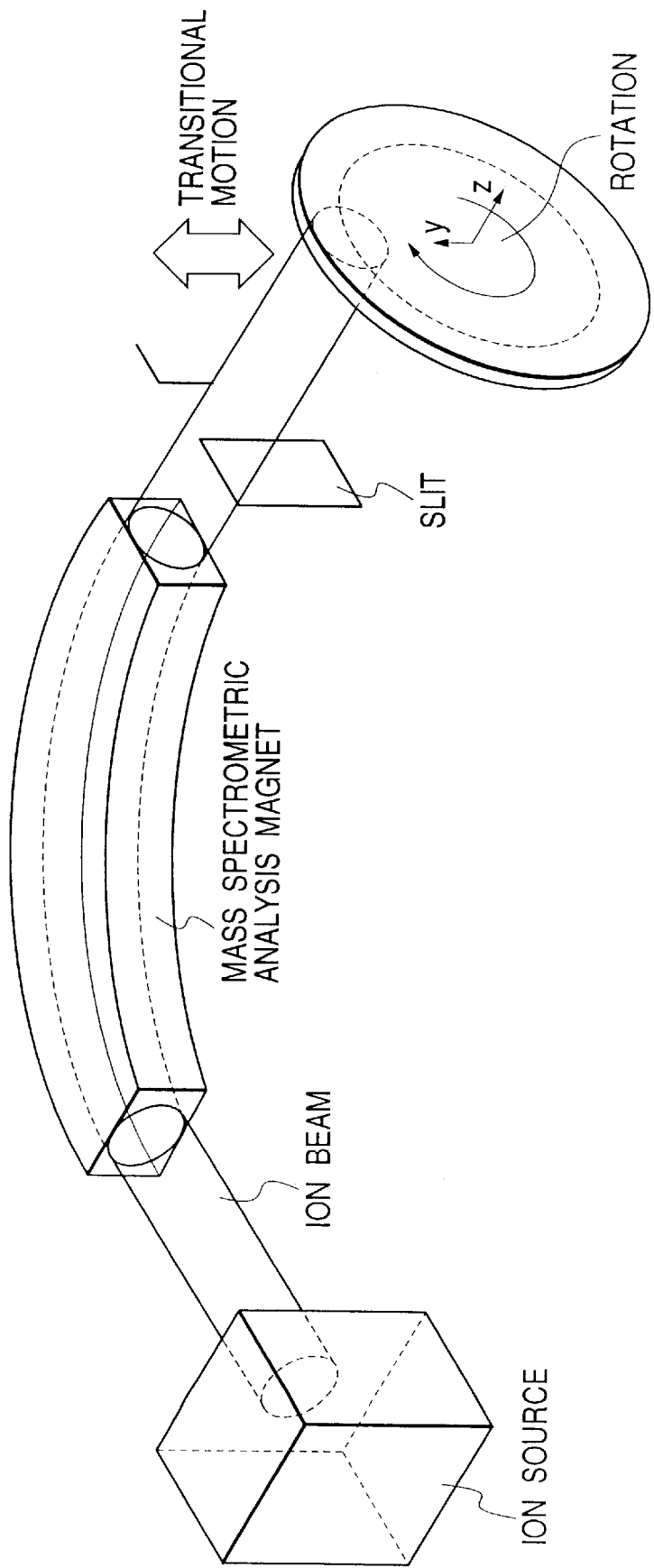
FIG. 18 is a schematic configuration view of a conventional ion injection apparatus in which a narrow beam is generated and curved by a mass spectrometer analysis magnet to pass through a long hole so that an ion beam is radiated onto a wafer making a rotating motion and a translation motion.
Figure 19:
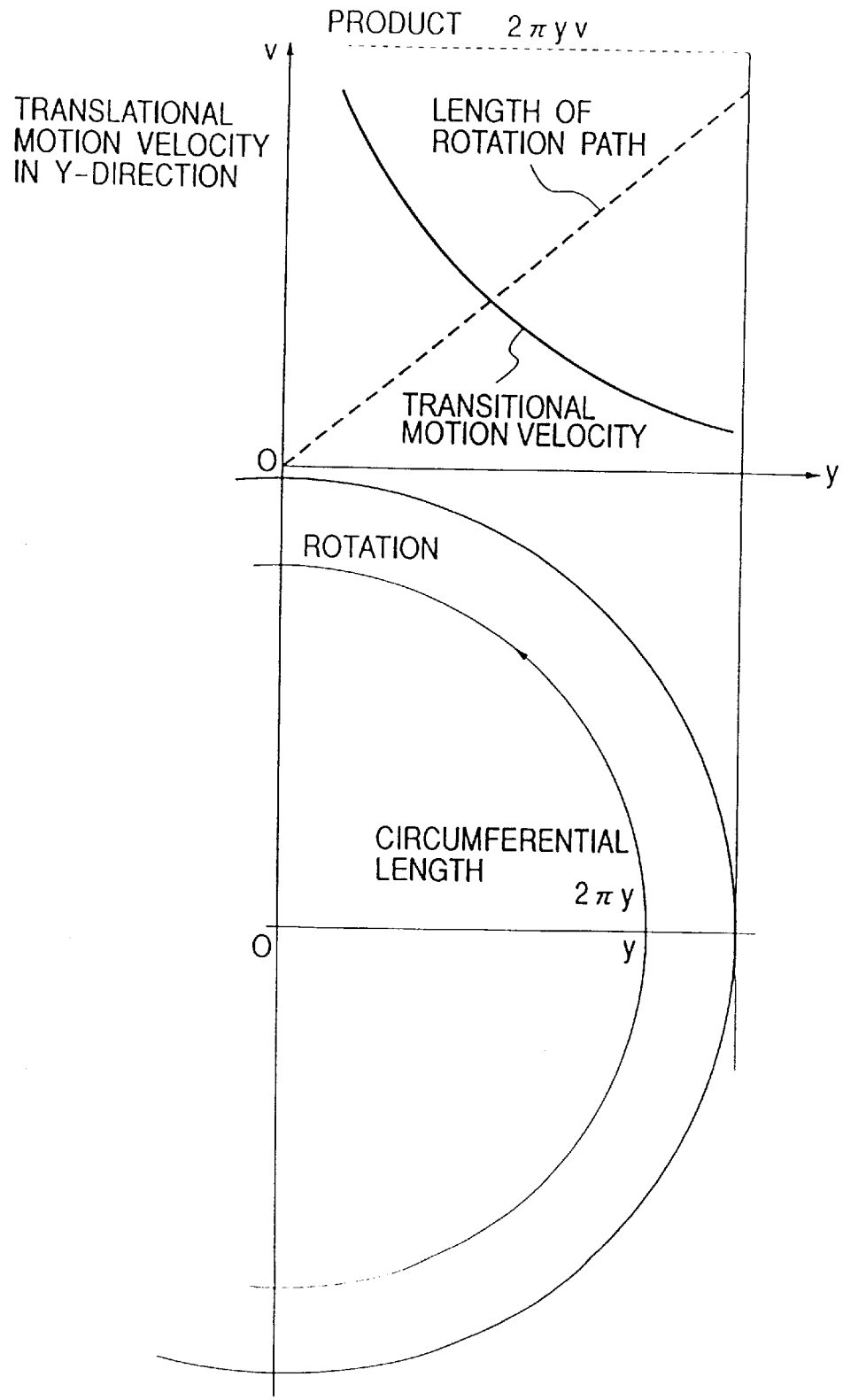
FIG. 19 is an explanatory view for explaining the necessity of moving the wafer translationally at a velocity inversely proportional to the distance y from the center in order to radiate ion beams evenly, in the conventional ion injection apparatus in which a narrow beam is generated and curved by a mass spectrometric analysis magnet to pass through a long hole so that an ion beam is radiated onto a wafer making a rotating motion and a translation motion.

3. FIGS. 15 and 16 show a beam envelope along the direction of movement of the beam. FIG. 15 shows the beam viewed from the y-direction. To express the whole of the beam with easy understanding, a perspective view is used. The ion source is taken as z=0 (different from z=0 in FIGS. 4 and 6). The z-direction path in a neighbor of the yoke forms a circular arc orbit. Form simplicification, the orbit is extended linearly. In FIG. 15 which shows the projection of the beam in the y-direction, a slightly divergent beam is generated in the ion source. The initial condition for the beam in the ion source is, for example, lateral half-width $x_0$=2.5 cm and half-width $dx_0$=30 mrad of the lateral spread of the beam. Because of 1 mrad=0.056°, the whole angle of the spread of the beam in the ion source is 1.7°. The beam is slightly spread and then slightly narrowed in the x-direction, so that the beam strikes against the subject while the spread of the beam is kept substantially constant. Here is shown the case where the beam reaches the subject without convergence in the x-direction. The slit plate 7 is provided in a position of about 200 cm, and the subject is placed in a position of 250 cm.

4. The envelope (projection onto the xz plane) shown in FIG. 15 is designed so that the envelope little changes in the perpendicular direction. This is a component directly affected by $B_y$, but the fact that the spread of the beam does not change means suitable divergence of the beam in the outlet of the ion source or a slight gradient of $B_y$ in the x-direction.

If the beam in the outlet of the ion source is entirely parallel ($dx_0$=0) and $B_y$ is constant in any point, the beam drawing a curve angle of 90° will be converged into one line (x=0). Although there is no problem in that case, the beam is not converged in this example and made so that the thickness of the beam in the x-direction is kept substantially constant. Therefore, the condition in which $B_y$ is kept constant is easily satisfied when there is the relation dx(x)= x/R in which dx(x) is the initial spread of the beam at a point x in the ion source. Contrariwise, to satisfy the condition of parallel beam ($dx_0$=0), it is necessary to give the x dependence of $B_y(x) = (MV)^{1/2}/0.69(R+x)$. Both may be used in combination.

5. That is, in this example, the beam is transported in the magnet without occurrence of any extreme converging/diverging function. In this manner, the parallelism of the beam can be held when the beam is incident onto the subject. Further, the distance from the magnet to the subject can be changed.

It is a matter of course that the beam may be converged or diverged in the x-direction. In this case, provision of a slit having a linear opening portion in the position where the beam is converged will suffice. In the case of convergence/divergence, contrariwise, a restricted condition arises so that the distance to the subject is determined.

Figure 9:
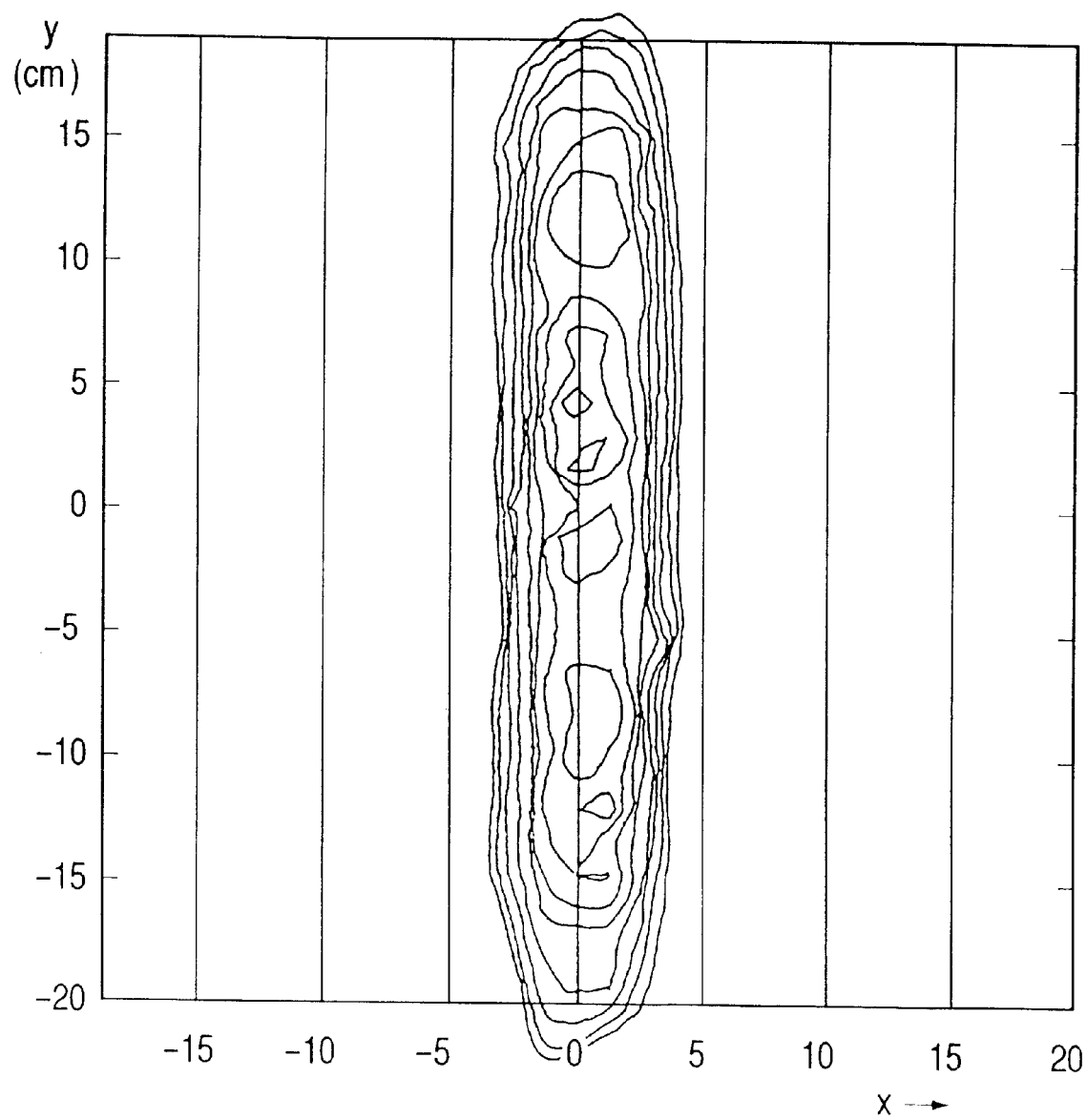
FIG. 9 is a distribution graph of the distribution of beam intensity expressed by contour lines in the xy plane, showing the distribution of boron ion B beam intensity in a subject (wafer) surface in the case where a beam of boron ions B containing carbon ions C as impurities is radiated onto a subject.
Figure 10:
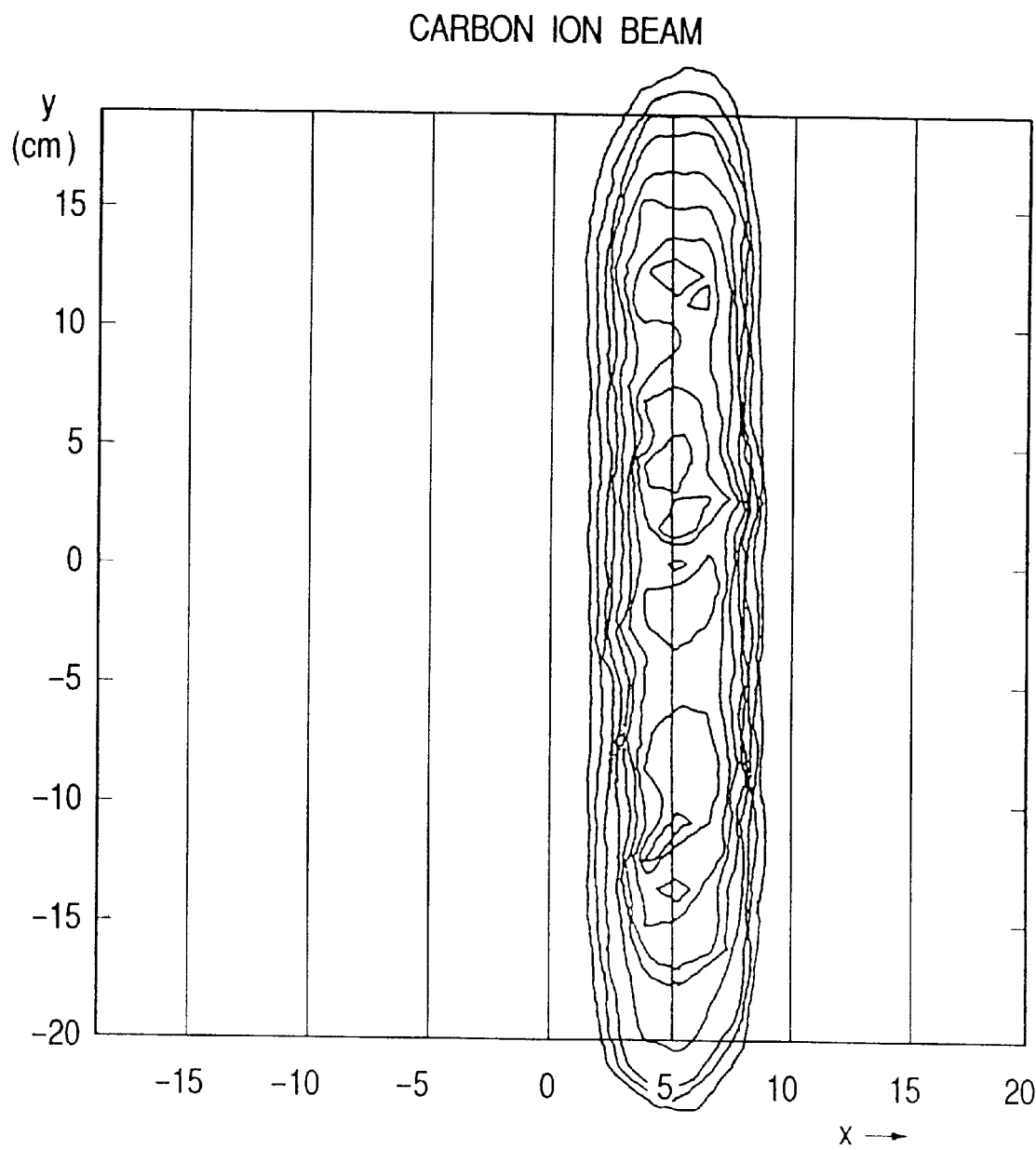
FIG. 10 is a distribution graph of the distribution of beam intensity expressed by contour lines in the xy plane, showing the distribution of beam intensity of carbon ions C as impurities in a subject (wafer) surface in the case where a beam of boron ions B containing carbon ions C as impurities is radiated onto a subject.

6. FIGS. 9 and 10 show beam distributions in wafers. It is now assumed that carbon C is contained as impurities when boron B ions are injected. In FIG. 9, the distribution of boron B ions in a wafer (subject) is expressed by contour lines. The abscissa axis shows an x-coordinate and the ordinate axis shows a y-coordinate. It is apparent that the beam has a spread of about 5 cm with reference to the center line (x=0). In FIG. 10, the distribution of carbon ions in a wafer is expressed by contour lines. It is apparent that the beam is formed as a beam bundle having a peak at a position apart from the center line by a distance of about 5 cm (x=5).

7. This is obtained as a result of pursuit of the orbit of the beam by calculation of the product of a matrix expressing characteristic of respective constituent elements of a beam optical system in the condition that the beam having a uniform distribution is generated from the ion source on the assumption that uniform magnetic field ($B_y$) is formed in the perpendicular direction.

8. Actually, the slit plate 7 is put between the magnet and the wafer. If the lateral width of the opening of the slit plate is selected to be substantially equal to the initial spread (5 cm) of the beam, carbon ions C strike against the slit plate so as to be removed. Only B ions can pass through the opening of the slit plate. The C ions are thoroughly removed from the wafer. Only B ions reach the wafer. 9. FIGS. 11 to 14 show beam emittance in wafers. That is, FIGS. 11 to 14 show x- and y-direction spreads and spread angles of the beam at z=250 cm in FIGS. 15 and 16. Of course, this varies in accordance with the spread $2x_0$ and spread angle $2dx_0$ of the beam in the ion source. This varies also in accordance with the distribution of the magnetic field $B_y$.

Figure 11:
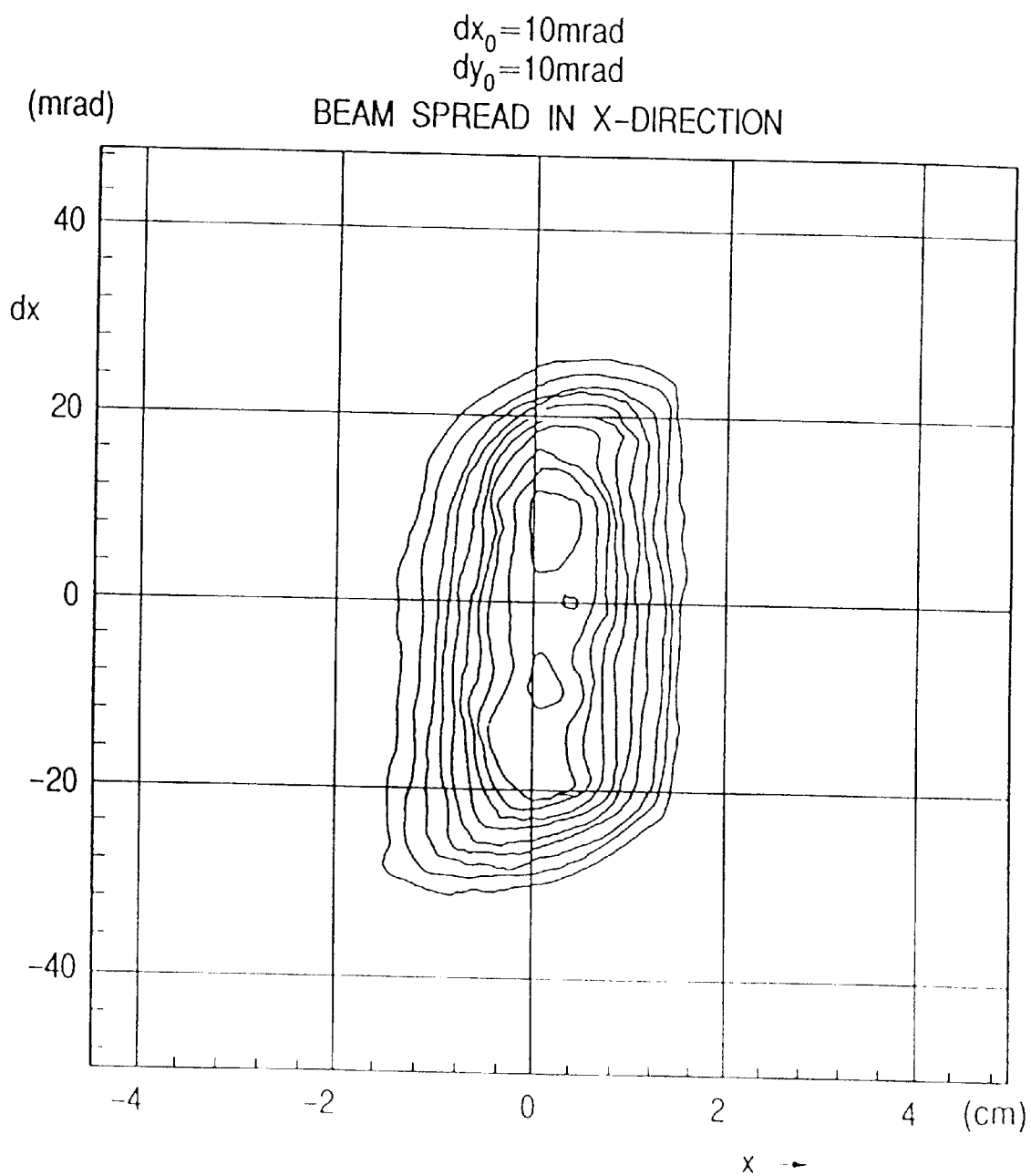
FIG. 11 is a graph of the x-direction spread x and spread angle dx, expressed by contour lines, of a beam deflected by the magnet and reaching the wafer in the case where the initial beam spread condition in the ion source is $x_0$=2.5 cm, $dx_0$=10 mrad, $y_0$=36 cm and $dy_0$10 mrad, in which abscissa axis shows the lateral spread x, and the ordinate axis shows the spread angle dx.
Figure 12:
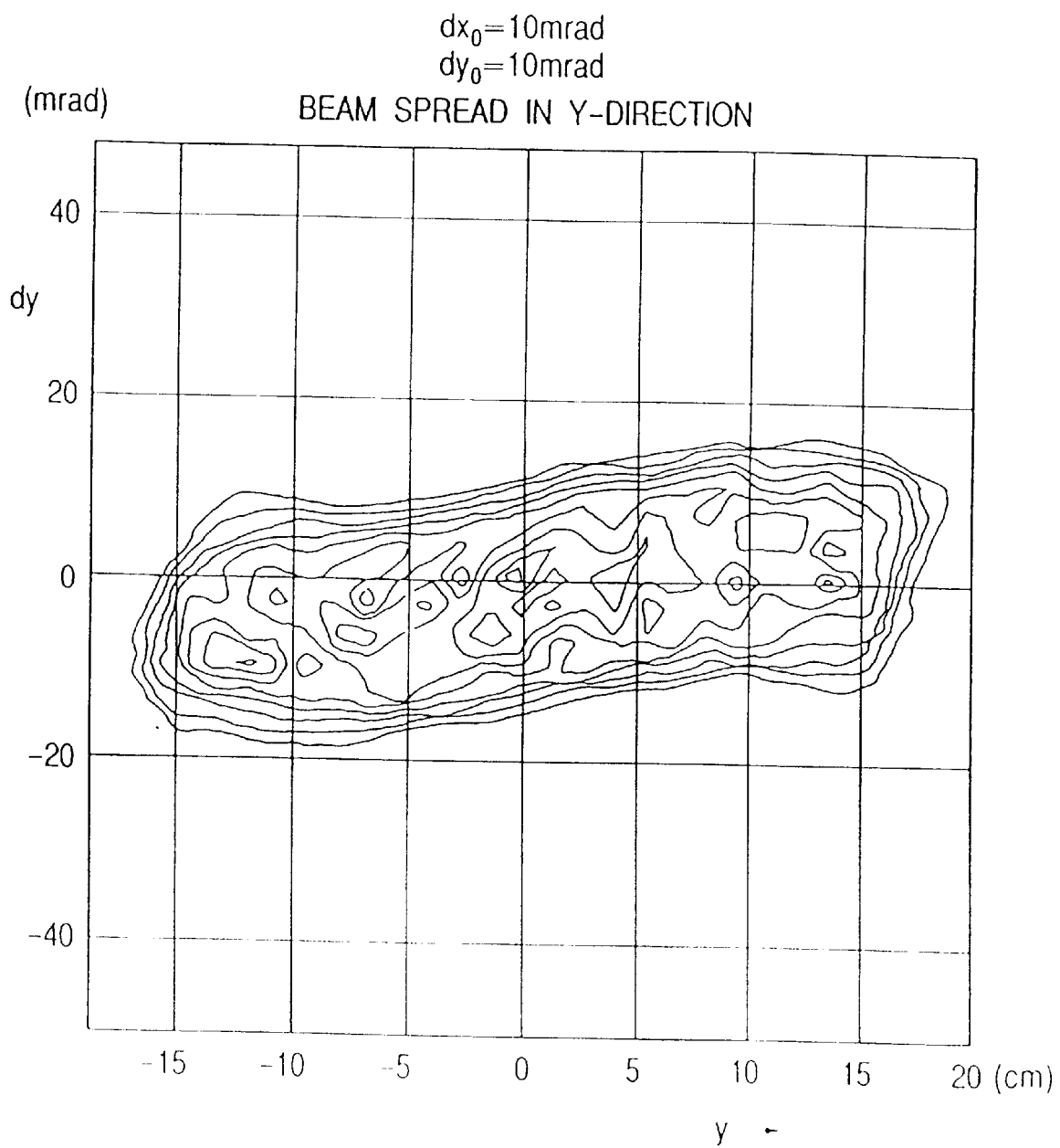
FIG. 12 is a graph of the y-direction spread y and spread angle dy, expressed by contour lines, of a beam deflected by the magnet and reaching the wafer in the case where the initial beam spread condition in the ion source is $x_0$=2.5 cm, $dx_0$=10 mrad, $y_0$=36 cm and $dy_0$10 mrad, in which abscissa axis shows the longitudinal spread y, and the ordinate axis shows the spread angle dry.

In an embodiment in FIGS. 11 and 12, the initial spread in the ion source is $x_0$=2.5 cm (the whole width is 5 cm), $dx_0$=10 mrad, $y_0$=18 cm (the whole length is 36 cm) and $dy_0$=10 mrad. In FIG. 11, the x-direction spread in a wafer and the angle of the x-direction spread are expressed by contour lines. The spread of the beam is reduced to about 2 cm. Because $dx_0$ is small, the beam is converged when the curve angle is 90°. The angle of divergence is about ±20°. The y-direction spread in the wafer is about 36 cm and little changes as shown in FIG. 12. The angle of the y-direction spread is no larger than about 15 mrad.

Figure 13:
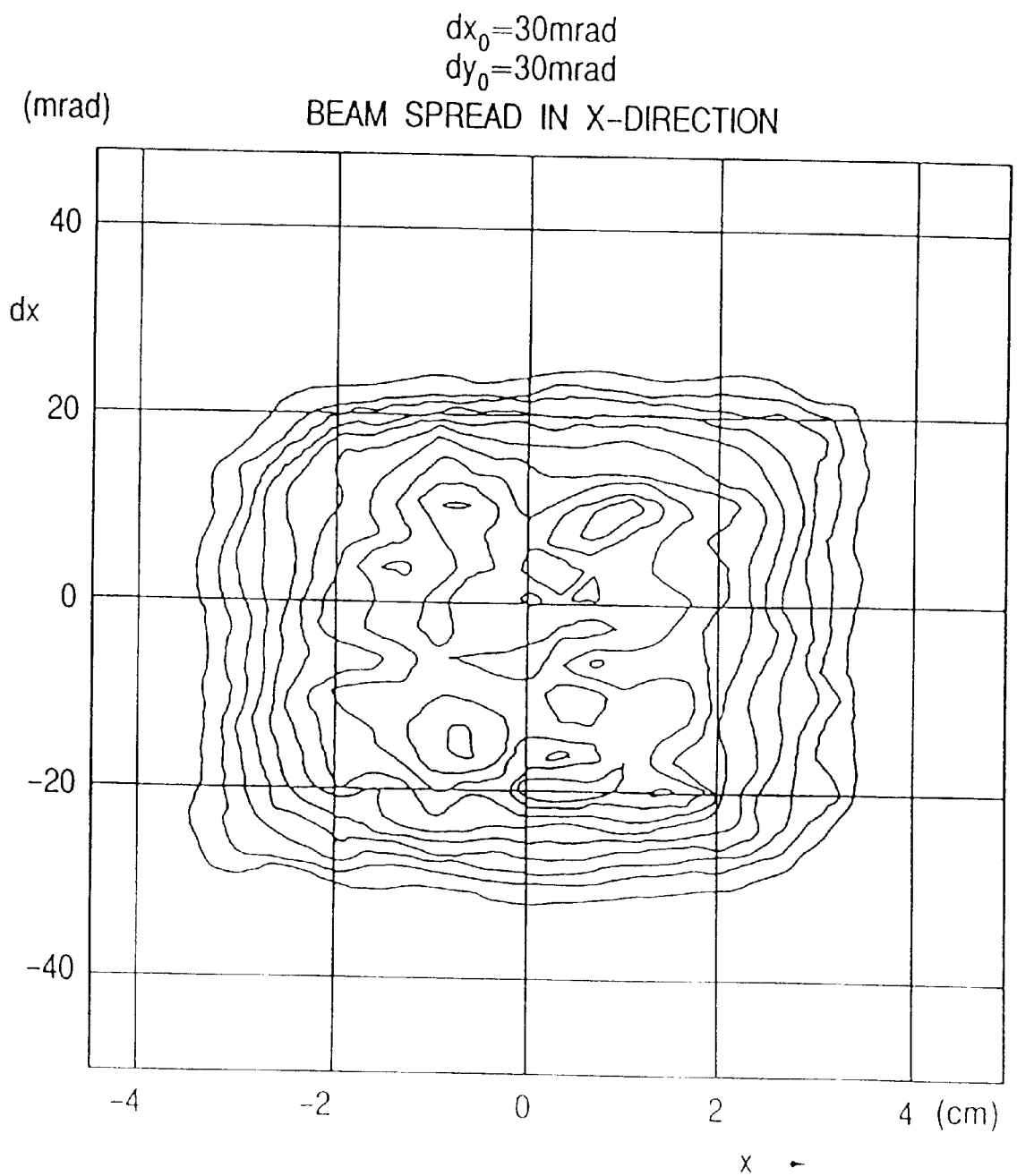
FIG. 13 is a graph of the x-direction spread x and spread angle dx, expressed by contour lines, of a beam deflected by the magnet and reaching the wafer in the case where the initial beam spread condition in the ion source is $x_0$=2.5 cm, $dx_0$=30 mrad, $y_0$=36 cm and $dy_0$=30 mrad, in which the abscissa axis shows the lateral spread x, and the ordinate axis shows the spread angle dx.
Figure 14:
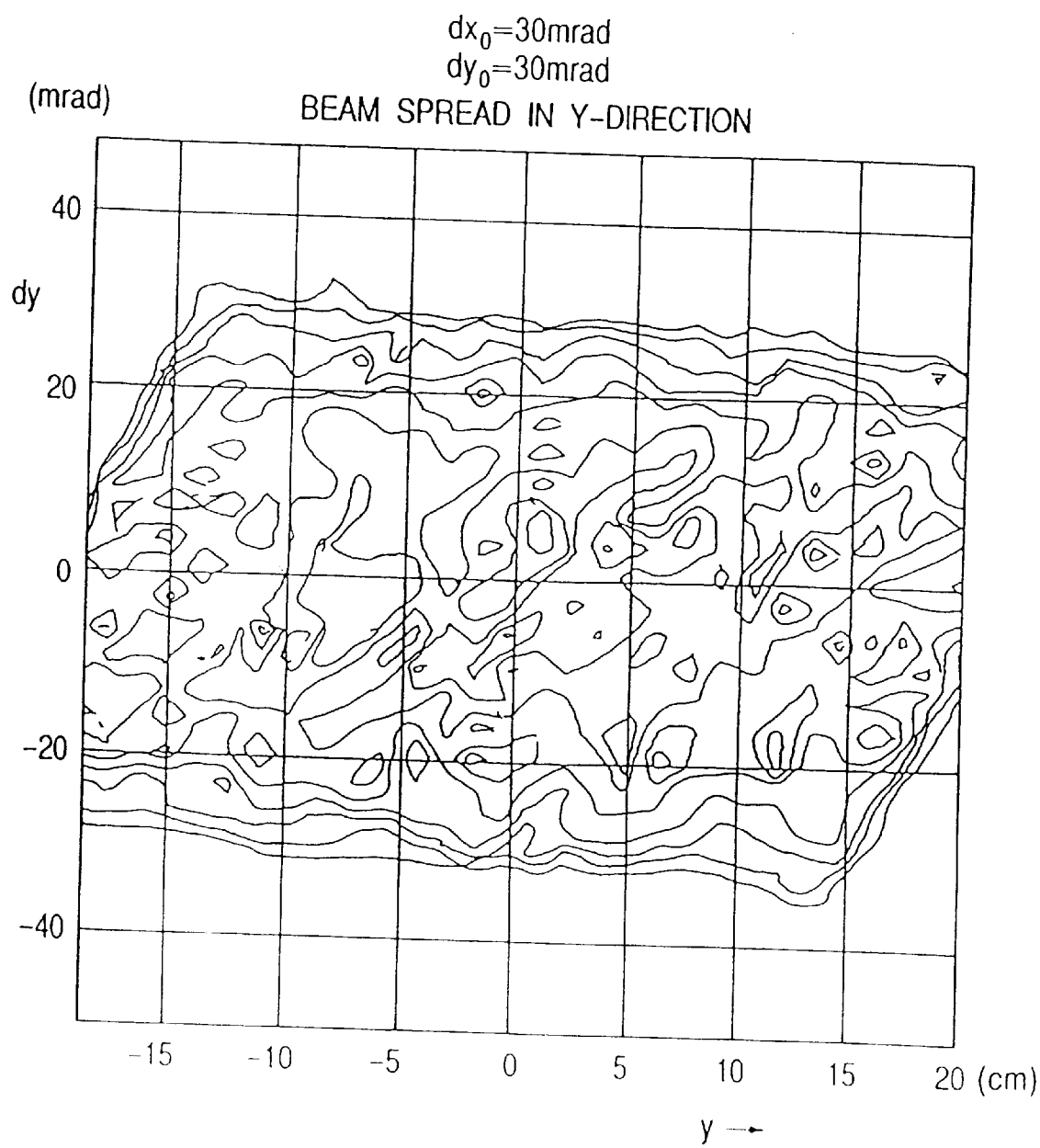
FIG. 14 is a graph of the y-direction spread y and spread angle dy, expressed by contour lines, of a beam deflected by the magnet and reaching the wafer in the case where the initial beam spread condition in the ion source is $x_0$=2.5 cm, $dx_0$=30 mrad, $y_0$=36 cm and $dy_0$=30 mrad, in which the abscissa axis shows the longitudinal spread y, and the ordinate axis shows the spread angle dy.

In an embodiment in FIGS. 13 and 14, the initial spread in the ion source is $x_0$=2.5 cm (the whole width is 5 cm), $dx_0$=30 mrad, $y_0$=18 cm (the whole length is 36 cm) and $dy_0$=30 mrad. In FIG. 13, the x-direction spread in a wafer and the angle of the x-direction spread are expressed by contour lines. The spread of the beam is about 5 cm which is substantially equal to the initial width. This is because the beam is spread at 30 mrad initially. The angle of divergence is about ±25°. The y-direction spread in the wafer is in a range of from about 30 to about 40 cm and little changes as shown in FIG. 12. The angle of the y-direction spread is in a range of from about 20 to about 30 mrad.

10. The angle of divergence is generally suppressed to be not larger than several degrees (3 degrees). Although the angle of divergence and the distribution spread in the wafer can be changed if the initial condition is changed, the fluctuation of the beam density in the wafer is very small because the angle of divergence can be suppressed to be not larger than 3 degrees.

Mode for Using the Apparatus

1. Before injection, ion beams can be adjusted by means of a Farady cup 11 which is set in front of the substrate or movably provided in front of the substrate.

2. This Faraday cup can measure an ion current. While magnet coil currents are changed in one direction, mass spectra are measured so that confirmation can be made as to whether unnecessary ions are separated or not.

3. Further, the Faraday cup can measure the distribution of the beam in the longitudinal direction (y-direction) of the beam. Adjustment for making the beam uniform can be performed. That is, the distribution of plasma in the ion source is adjusted or coil currents are changed to adjust the distribution of the magnetic field in the magnet so that the distribution of the beam in the lengthwise (longitudinal) direction can be made uniform.

4. For example, configuration in which thin slit-like beam detectors are arranged in the form of an array can be adopted in this measurer.

5. A mask having an array of slits arranged at regular intervals corresponding to the intervals of the Faraday slit array is provided just after the slit plate 7. While the mask is moved horizontally, a mask position giving the maximum beam quantity is measured with respect to each Faraday so that the parallelism of the beam is measured. If the parallelism is insufficient, currents flowing in the dipole magnetic field correction coils (Sa, Sb, Sc and Sd) are controlled to adjust the parallelism.

6. Because the beam has a rectangular section, the substrate is moved translationally (Sx) so that the ion beam can be injected into the whole surface of the substrate.

Effects of the present invention will be described as follows.

1. A large-area ion source and a window/frame type magnet having a large gap are used in combination so that a large-area beam can be subjected to mass spectrometric analysis and transported with a simple configuration. When a large-area ion beam was generated, the beam could not be subjected to mass spectrometric analysis in the prior art. According to the present invention, however, the large-area ion beam is bent so that mass spectrometric analysis can be performed.

2. Furthermore, the configuration of the magnet is simple. The beam converging function can be adjusted dynamically. Main coils, sub-coils, etc. which are curved are wound on the curved yoke and currents for the coils are changed individually so that a uniform magnetic field $B_y$ can be generated in the wide gap.

3. Because the large-area ion beam is used, the current density can be reduced so that injection substantially free from the occurrence of charging-up can be performed. When a narrow beam was used like the prior art, it was necessary to increase the current density in order to enhance throughput. If the current density is high, charging-up often occurs so that devices on the wafer may be destroyed and damaged.

4. Because the large-area ion beam is used, the whole ion current is large so that the ability of processing the wafer can be enhanced.

5. Because a beam slit is provided, particles emitted from the ion source can be prevented from reaching the wafer.

6. Because mass spectrometric separation is performed clearly, the possibility of metal contamination is reduced. The mass spectrometric analysis of the large-area beam could not be performed by means of the magnet. According to the present invention, however, a one-directionally long beam is bent in a plane perpendicular to the longitudinal direction of the beam and subjected to mass spectrometric analysis, so that impurities can be prevented from being mixed.

7. Also a phenomenon that scattered-resist products generated by injection flow backward to the beam line can be suppressed. This is based on a function of the slit plate.

8. The running distance of the beam in the outside of the center orbit of beam deflection becomes substantially equal to that in the inside of the center orbit.

9. This is because the width of the beam is small. Because there is no difference between the running distances, the probability that the moving beam may collide with gas molecules so as to change to neutral particles by charge conversion is substantially equalized in any point of a section of the beam.

10. Accordingly, factors which worsens the uniformity of injection in the wafer can be removed.

11. A magnetic shield is set in the ion source portion in order to suppress the magnetic field leaking from the magnet, so that control of the ion source can be performed without influence of the magnet.

12. Not only the plasma distribution of the ion source is adjusted but also a function of adjusting the beam dynamically is given to the magnet. This is because a plurality of main coils and a plurality of sub-coils are provided on left and right parts of the yoke so that currents can be controlled individually. The distribution of the magnetic field $B_y$ is controlled so that the distribution of the beam can be adjusted.

Further, it is possible to use a method in which: a dipole coil for generating a magnetic field required for deflecting the beam is set in the inside of the yoke having a rectangular opening; and sub-coils for controlling the distribution of the magnetic field are would on the inside and outside of the yoke as described in the present invention. Of course, the main dipole coil is required to be wound in the form of a saddle so that movement of the beam is not disturbed. The horizontal distribution of the magnetic field can be controlled on the basis of the difference between the ampere-turn number in the inner sub-coil and the ampere-turn number in the outer sub-coil, so that convergence/divergence of the beam can be adjusted.

What is claimed is:

1. An apparatus for deflecting charged particles, comprising:

an ion source having an ion drawing outlet long in a certain direction for generating a belt-like ion beam;

a magnet comprising a yoke of a ferromagnetic material having a rectangular section and being curved in its longitudinal direction, a plurality of coils wound on a curved inner frame of said yoke so as to be parallel with a direction of movement of the beam, and a plurality of coils wound on a curved outer frame of said yoke so as to be parallel with the direction of movement of the beam;

a slit plate having a long hole long in the same direction as the longitudinal direction of said ion source and provided on a beam locus of the beam and in posterior to said magnet; and a mechanism for holding a subject so that said subject makes a translational motion in a direction of a short side of a section of the beam;

wherein magnetic field $B_y$ substantially uniform in the same direction as the longitudinal direction of the ion source is generated in the inside of said yoke by adjustment of currents in said plurality of coils, so that a belt-like ion beam having a section long in a certain direction is emitted from said ion source, made to pass through said yoke so as to be curved in the direction of the short side of the section of the beam by the longitudinal magnetic field, made to pass through the long hole of the slit plate to remove unnecessary ions and radiated onto the subject.

2. The apparatus for deflecting charged particles according to claim 1, wherein said magnet comprises upper and lower separate coils wound on the inside of a frame of the yoke of a ferromagnetic material so as to be parallel with the direction of movement of the beam, and a plurality of coils wound on inner and outer frames, respectively, of the yoke so as to be parallel with the direction of movement of the beam.

3. The apparatus for deflecting charged particles according to claim 1, wherein the ion beam has a section long in a certain direction, and the sectional shape of the beam emitted from the ion source is designed so that the size in the longer side is not smaller than 20 cm and the size in the shorter side is in a range of from 2 cm to 10 cm.

4. The apparatus for deflecting charged particles according to claim 1, wherein said ion source is surrounded by a magnetic shield formed of a material of high magnetic permeability.

5. The apparatus for deflecting charged particles according to claim 1, wherein said ion source have a plurality of electron emitting sources in one direction in order to generate the beam long in a certain direction so that the quantity of electrons is adjusted to change the distribution of ion source plasma to change the distribution of beam intensity in the wafer.

6. The apparatus for deflecting charged particles according to claim 1, further comprising first measuring means for measuring the distribution of the ion beam reaching the subject, said measuring means being provided just in front of the subject, just in rear of the subject or on the same plane of the subject; wherein the shape of the ion beam, the size of the ion beam and the quantity of the current in the ion beam is detected to control the coil current in the magnet and the running state of the ion source.

7. The apparatus for deflecting charged particles according to claim 6, wherein said first measuring means is a movable Faraday cup or a fixed multi-Faraday cup.

8. The apparatus for deflecting charged particles according to claim 1, further comprising monitoring means for measuring the parallelism of the incident angle of the ion beam reaching the wafer may be provided so that the parallelism of the ion beam is adjusted by control of the coil current in the magnet.

9. The apparatus for deflecting charged particles according to claim 1, further comprising a second measuring means for measuring the lengthwise distribution of the ion beam quantity integrated in the direction of the short side of the one-directionally long belt-like ion beam so that the lengthwise distribution of the ion beam quantity is adjusted by changing the magnet coil current and the running state of the ion source to perform feedback control to obtain a desired and generally uniform quantity of injection.

10. The apparatus for deflecting charged particles according to claim 1, wherein the one-directionally long beam is a large-area beam having a length of not smaller than 20 cm and a width of from about 2 cm to about 10 cm.

11. The apparatus for deflecting charged particles according to claim 1, further comprising detecting means, capable of moving translationally, for examining the beam current density, the beam spread and the shape of the beam in advance, said detecting means being provided just in front of the subject, just in rear of the subject or on one and the same plane as the subject;
wherein if the beam does not have a desired shape and density, the coil currents in the magnet and parameters for the ion source are adjusted to obtain a desired ion beam sectional shape.

12. The apparatus for deflecting charged particles according to claim 11, further comprising a slit plate, capable of moving translationally, being provided in front of said detecting means so that the beam passing through the opening of the slit plate is detected to thereby examine the parallelism of the beam.

13. The apparatus for deflecting charged particles according to claim 1, wherein the angle θ of deflection of the one-directionally long ion beam is in a range of from about 60° to about 150°.

14. A method for deflecting charged particles using an apparatus comprising: an ion source having an ion drawing outlet long in a certain direction for generating a belt-like ion beam; a magnet comprising a yoke of a ferromagnetic material having a rectangular section and being curved in its longitudinal direction, a plurality of coils wound on a curved inner frame of said yoke so as to be parallel with a direction of movement of the beam, and a plurality of coils wound on a curved outer frame of said yoke so as to be parallel with the direction of movement of the beam; a slit plate having a long hole long in the same direction as the longitudinal direction of said ion source and provided on a beam locus of the beam and in posterior to said magnet; and a mechanism for holding a subject so that said subject makes a translational motion in a direction of a short side of a section of the beam;
said method comprising the steps of:
generating magnetic field $B_y$ substantially uniform in the same direction as the longitudinal direction of the ion source in the inside of said yoke by adjustment of currents in said plurality of coils, so that a belt-like ion beam having a section long in a certain direction is emitted from said ion source;
passing said ion beam through said yoke so as to be curved in the direction of the short side of the section of the beam by the longitudinal magnetic field; and
passing said ion beam through the long hole of the slit plate to remove unnecessary ions and radiated onto the subject.

* * * * *